United States Patent
Kiridoshi et al.

(10) Patent No.: US 9,354,523 B2
(45) Date of Patent: May 31, 2016

(54) COMPOSITION FOR RESIST PATTERN-REFINEMENT, AND FINE PATTERN-FORMING METHOD

(71) Applicant: JSR Corporation, Minato-ku (JP)

(72) Inventors: Yuuko Kiridoshi, Tokyo (JP); Hiroyuki Nii, Tokyo (JP); Tsuyoshi Furukawa, Tokyo (JP); Takeo Shioya, Tokyo (JP)

(73) Assignee: JSR Corporation, Minato-ku (JP)

( * ) Notice: Subject to any disclaimer, the term of this patent is extended or adjusted under 35 U.S.C. 154(b) by 0 days.

(21) Appl. No.: 14/795,153

(22) Filed: Jul. 9, 2015

(65) Prior Publication Data

US 2016/0011513 A1 Jan. 14, 2016

(30) Foreign Application Priority Data

Jul. 10, 2014 (JP) .................................. 2014-142761
Jul. 7, 2015 (JP) .................................. 2015-136458

(51) Int. Cl.
G03F 7/40 (2006.01)
G03F 7/004 (2006.01)
G03F 7/039 (2006.01)
G03F 7/30 (2006.01)
G03F 7/32 (2006.01)
G03F 7/20 (2006.01)

(52) U.S. Cl.
CPC ............... *G03F 7/40* (2013.01); *G03F 7/0045* (2013.01); *G03F 7/0046* (2013.01); *G03F 7/0392* (2013.01); *G03F 7/0397* (2013.01); *G03F 7/2041* (2013.01); *G03F 7/30* (2013.01); *G03F 7/322* (2013.01); *G03F 7/405* (2013.01)

(58) Field of Classification Search
None
See application file for complete search history.

(56) References Cited

U.S. PATENT DOCUMENTS

| | | | |
|---|---|---|---|
| 4,910,122 A | 3/1990 | Arnold et al. | |
| 8,067,148 B2 * | 11/2011 | Endou | G03F 7/0392 430/322 |
| 2013/0171825 A1 * | 7/2013 | Xu | H01L 21/0274 438/694 |
| 2015/0212414 A1 * | 7/2015 | Pohlers | G03F 7/0397 430/270.1 |

FOREIGN PATENT DOCUMENTS

| | | |
|---|---|---|
| JP | 59-93448 | 5/1984 |
| JP | 5-188598 | 7/1993 |
| JP | 6-12452 | 2/1994 |
| JP | 2001-281886 | 10/2001 |
| JP | 2005-352384 | 12/2005 |
| JP | 2009-134088 | 6/2009 |
| WO | WO 2008/047678 A1 | 4/2008 |

* cited by examiner

*Primary Examiner* — Sin Lee
(74) *Attorney, Agent, or Firm* — Oblon, McClelland, Maier & Neustadt, L.L.P.

(57) ABSTRACT

A composition for resist pattern-refinement includes an ion represented by formula (1-1), an ion represented by formula (1-2), an ion represented by formula (2-1), an ion represented by formula (2-2) and a solvent. A total amount of the ions blended is no less than 50% by mass with respect to a sum of components other than the solvent. $R^1$ represents a monovalent organic group having 1 to 30 carbon atoms or a fluorine atom; Z represents a single bond or a divalent linking group; $R^2$ represents a single bond, a divalent hydrocarbon group having 1 to 10 carbon atoms or a divalent fluorinated hydrocarbon group having 1 to 10 carbon atoms; $M^+$ represents a monovalent cation; and $R^3$ represents a monovalent organic group having 1 to 30 carbon atoms.

10 Claims, 1 Drawing Sheet

COMPOSITION FOR RESIST PATTERN-REFINEMENT, AND FINE PATTERN-FORMING METHOD

BACKGROUND OF THE INVENTION

1. Field of Invention

The present invention relates to a composition for resist pattern-refinement, and a fine pattern-forming method.

2. Description of the Related Art

Enhanced integration of semiconductor devices has been accompanied by increasing demands for microfabrication of substrate patterns, specifically, miniaturization of the line width of patterns in manufacturing processes of the semiconductor devices. Thus, a technique for making the resist pattern that serves as a mask therefor further finer has been needed.

Conventionally, microfabrication of a resist pattern has been performed through shortening of a wavelength in the exposure in formation of a resist pattern through applying a radiation-sensitive resin composition on a substrate, exposure and development. However, shortening of the wavelength requires a lot of costs for e.g., exchange of the exposure device, etc., and there are limitations to shortening of the exposure wavelength.

As other method for obtaining a fine resist pattern, a technique has been studied in which a refining process for decreasing the line width of the formed resist pattern is carried out. A known composition for resist pattern-refinement for use in such a method contains an acidic aqueous solution of a resin (see Japanese Unexamined Patent Application, Publication No. 2001-281886). According to such techniques, formation of a fine resist pattern out of the limitation at the exposure wavelength is reportedly enabled.

However, although the line width of the resist pattern can be decreased when the conventional composition for resist pattern-refinement is used, there arise a disadvantage of a failure to favorably perform the microfabrication, such as inferior accuracy of the resulting pattern, occurrence of pattern collapse, and the like.

PRIOR ART DOCUMENTS

Patent Documents

Patent Document 1: Japanese Unexamined Patent Application, Publication No. 2001-281886

SUMMARY OF THE INVENTION

The present invention was made in view of the foregoing circumstances, and an object of the invention is to provide a composition for resist pattern-refinement that enables accurate and favorable microfabrication of a resist pattern.

According to an aspect of the present invention made for solving the aforementioned problems, a composition for resist pattern-refinement contains an ion represented by the following formula (1-1) (hereinafter, may be also referred to as "ion (1-1)"), an ion represented by the following formula (1-2) (hereinafter, may be also referred to as "ion (1-2)"), an ion represented by the following formula (2-1) (hereinafter, may be also referred to as "ion (2-1)"), an ion represented by the following formula (2-2) (hereinafter, may be also referred to as "ion (2-2)"), and a solvent (hereinafter, may be also referred to as "(C) solvent" or "solvent (C)"), in which the total amount of the ions blended is no less than 50% by mass with respect to the sum of the components other than the solvent (C).

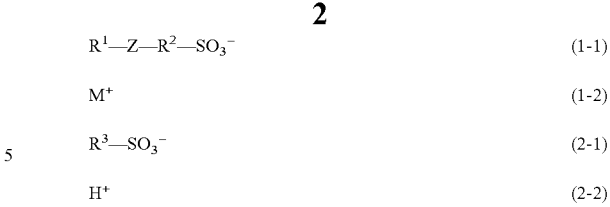

In the formula (1-1), $R^1$ represents a monovalent organic group having 1 to 30 carbon atoms or a fluorine atom; Z represents a single bond or a divalent linking group; and $R^2$ represents a single bond, a divalent hydrocarbon group having 1 to 10 carbon atoms or a divalent fluorinated hydrocarbon group having 1 to 10 carbon atoms.

In the formula (1-2), $M^+$ represents a monovalent cation.

In the formula (2-1), $R^3$ represents a monovalent organic group having 1 to 30 carbon atoms.

According to another aspect of the present invention made for solving the aforementioned problems, a fine pattern-forming method includes the steps of: forming a resist pattern; and refining the resist pattern with a composition for resist pattern-refinement, in which the composition for resist pattern-refinement described above is used as the composition for resist pattern-refinement.

The "pKa value" as referred to herein means a logarithmic value of a reciprocal number of an acid dissociate constant Ka of an acid.

Effects of the Invention

According to the composition for resist pattern-refinement and the fine pattern-forming method of the aspects of the present invention, accurate and favorable microfabrication of a resist pattern is enabled. Therefore, these can be extremely suitably used in the field of microfabrication typified by manufacture of integrated circuit elements for which further progress of miniaturization from now on is expected.

DESCRIPTION OF THE PREFERRED EMBODIMENTS

Composition for Resist Pattern-Refinement

Figure 1:
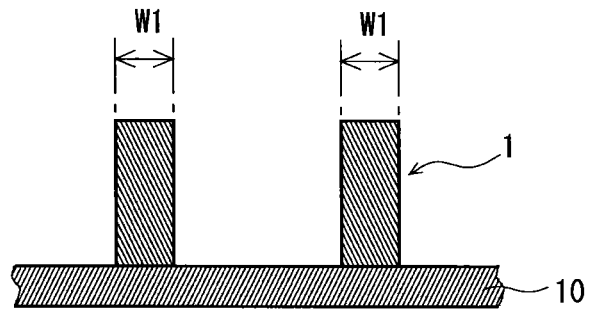
FIG. 1 shows a cross sectional view illustrating one example of a state after forming a resist pattern.

The composition for resist pattern-refinement contains the ion (1-1), the ion (1-2), the ion (2-1), the ion (2-2) and the solvent (C), in which the total amount of the ions blended is no less than 50% by mass with respect to the sum of the components other than the solvent (C).

In the above formula (1-1), $R^1$ represents a monovalent organic group having 1 to 30 carbon atoms or a fluorine atom; Z represents a single bond or a divalent linking group; and $R^2$ represents a single bond, a divalent hydrocarbon group having 1 to 10 carbon atoms or a divalent fluorinated hydrocarbon group having 1 to 10 carbon atoms.

In the above formula (1-2), $M^+$ represents a monovalent cation.

In the above formula (2-1), $R^3$ represents a monovalent organic group having 1 to 30 carbon atoms.

The composition for resist pattern-refinement contains: the ion (1-1) that is a monovalent sulfonate anion; the ion (1-2) that is a monovalent cation; the ion (2-1) that is a monovalent sulfonate anion; and the ion (2-2) that is a proton. According to the composition for resist pattern-refinement, owing to containing the four kinds of ions, and to the total amount of the four kinds of ions blended falling within the above range, it is believed that an acid (hereinafter, may be also referred to as "acid (a)") can be properly generated from the ion (1-1) that is a monovalent sulfonate anion, and the ion (2-2) that is a proton. The generated acid (a) can allow acid-labile groups and the like of the surface layer of the resist pattern on which the composition for resist pattern-refinement was applied to be properly dissociated. As a result, LWR of the resulting fine pattern can be reduced, and pattern collapse can be decreased. In addition, a favorable degree of refinement can be attained at high reproducibility. Accordingly, accurate and favorable microfabrication of a resist pattern is enabled. Hereinafter, each component of the composition for resist pattern-refinement is explained.

Ion (1-1)

The ion (1-1) is represented by the following formula (1-1).

$$R^1\text{—}Z\text{—}R^2\text{—}SO_3^- \quad (1\text{-}1)$$

In the above formula (1-1), $R^1$ represents a monovalent organic group having 1 to 30 carbon atoms or a fluorine atom; Z represents a single bond or a divalent linking group; and $R^2$ represents a single bond, a divalent hydrocarbon group having 1 to 10 carbon atoms or a divalent fluorinated hydrocarbon group having 1 to 10 carbon atoms.

The monovalent organic group having 1 to 30 carbon atoms represented by $R^1$ is exemplified by: a monovalent hydrocarbon group having 1 to 30 carbon atoms; (α) a group that includes a divalent hetero atom-containing group between two adjacent carbon atoms of the monovalent hydrocarbon group having 1 to 30 carbon atoms; and a group derived by substituting a hydrogen atom of the monovalent hydrocarbon group having 1 to 30 carbon atoms or the group (α) with a monovalent hetero atom-containing group, and the like.

Exemplary monovalent hydrocarbon group having 1 to 30 carbon atoms may include a monovalent chain hydrocarbon group having 1 to 30 carbon atoms, a monovalent alicyclic hydrocarbon group having 3 to 20 carbon atoms, a monovalent aromatic hydrocarbon group having 6 to 30 carbon atoms, and the like.

Examples of the monovalent chain hydrocarbon group having 1 to 30 carbon atoms include:

alkyl groups such as a methyl group, an ethyl group, a n-propyl group, an i-propyl group, a n-butyl group, an i-butyl group, a sec-butyl group, a t-butyl group and a n-pentyl group;

alkenyl groups such as an ethenyl group, a propenyl group, a butenyl group and a pentenyl group;

alkynyl groups such as an ethynyl group, a propynyl group, a butynyl group and a pentynyl group; and the like.

Examples of the monovalent alicyclic hydrocarbon group having 3 to 30 carbon atoms include:

monocyclic cycloalkyl groups such as a cyclopropyl group, a cyclobutyl group, a cyclopentyl group, a cyclohexyl group and a cyclooctyl group;

polycyclic cycloalkyl groups such as a norbornyl group, an adamantyl group, a tricyclodecyl group and a tetracyclododecyl group;

monocyclic cycloalkenyl groups such as a cyclopropenyl group, a cyclobutenyl group, a cyclopentenyl group and a cyclohexenyl group;

polycyclic cycloalkenyl groups such as a norbornenyl group and a tricyclodecenyl group; and the like.

Examples of the monovalent aromatic hydrocarbon group having 6 to 20 carbon atoms include:

aryl groups such as a phenyl group, a tolyl group, a xylyl group, a mesityl group, a naphthyl group, a methylnaphthyl group, an anthryl group and a methylanthryl group;

aralkyl groups such as a benzyl group, a phenethyl group, a naphthylmethyl group and an anthryl methyl group; and the like.

Examples of the hetero atom which may be contained in the monovalent and divalent hetero atom-containing group include halogen atoms such as a fluorine atom, a chlorine atom, a bromine atom and an iodine atom, an oxygen atom, a nitrogen atom, a sulfur atom, a phosphorus atom, and the like. Of these, a halogen atom, an oxygen atom, a nitrogen atom and a sulfur atom are preferred.

Examples of the divalent hetero atom-containing group include —O—, —S—, —CO—, —CS—, —NR'— (wherein, R' represents a monovalent hydrocarbon group having 1 to 20 carbon atoms), a group derived by combining at least two of these, and the like.

Examples of the monovalent hetero atom-containing group include: halogen atoms such as a fluorine atom, a chlorine atom, a bromine atom and an iodine atom, a hydroxy group, a carboxy group, a cyano group, a nitro group, and the like.

Of these, $R^1$ preferably includes a ring structure having 5 to 20 ring atoms, and $R^1$ is more preferably a group that includes an alicyclic hydrocarbon structure having 5 to 20 ring atoms or a group that includes an aromatic hydrocarbon structure having 6 to 20 ring atoms, still more preferably a group that includes an alicyclic hydrocarbon structure, and particularly preferably a group that includes an adamantane structure, a norbornane structure, a cyclohexane structure or a combination thereof. Alternatively, it is also preferred that $R^1$ is a fluorine atom.

The divalent linking group which may be represented by Z is exemplified by —O—, —S—, —NR'— (wherein, R' represents a monovalent hydrocarbon group having 1 to 20 carbon atoms), —CO—, —CS—, a group derived by combining one or two or more of these, or the like. Z preferably represents a single bond or —COO—.

The divalent hydrocarbon group having 1 to 10 carbon atoms which may be represented by $R^2$ is exemplified by a group that has 1 to 10 carbon atoms and that is derived by removing one hydrogen atom from the group exemplified in connection with the monovalent hydrocarbon group which may be represented by $R^1$, and the like.

Examples of the divalent fluorinated hydrocarbon group having 1 to 10 carbon atoms which may be represented by $R^2$ include:

fluorinated alkanediyl groups such as a fluoromethanediyl group, a difluoromethanediyl group, a difluoroethanediyl group, a trifluoroethanediyl group, a tetrafluoroethanediyl group, a difluoropropanediyl group and a tetrafluorobutanediyl group;

fluorinated cycloalkanediyl groups such as a fluorocyclopentanediyl group and a difluorocyclohexanediyl group;

fluorinated arenediyl groups such as a fluorobenzenediyl group and a difluorobenzenediyl group; and the like.

R² represents preferably a single bond or a divalent fluorinated hydrocarbon group, more preferably a single bond or a fluorinated alkanediyl group, still more preferably a fluorinated alkanediyl group, and particularly preferably a 1,1-difluoroethane-1,2-diyl group, a 1,1,2,2-tetrafluorohexane-1,6-diyl group, a 1,1,1-trifluoropropane-2,3-diyl group, a 3,3,3-trifluoropropane-1,2-diyl group, a nonafluoro-n-butane-1,4-diyl group and difluoromethanediyl group.

R² represents preferably a divalent fluorinated hydrocarbon group, more preferably a fluorinated alkanediyl group, and still more preferably a difluoromethanediyl group, a difluoroethanediyl group and a tetrafluoroethanediyl group.

The ion (1-1) is preferably a 2-(adamantan-1-yl)-1,1-difluoroethane-1-sulfonate anion, a 6-(adamantan-1-ylcarbonyloxy)-1,1,2,2-tetrafluorohexane-1-sulfonate anion, a 2-(adamantan-1-yloxycarbonyl)-3,3,3-trifluoropropane-1-sulfonate anion, a 3-(adamantan-1-yloxycarbonyl)-1,1,1-trifluoropropane-2-sulfonate anion, a 2-(adamantan-1-ylcarbonyloxy)-3,3,3-trifluoropropane-1-sulfonate anion, a 5,6-di(cyclohexyloxycarbonyl)norbornane-2-sulfonate anion, a nonafluoro-n-butane-1-sulfonate anion and adamantan-1-ylmethoxycarbonyl-1,1-difluoromethanesulfonate anion.

The lower limit of the amount of the ion (1-1) blended with respect to the sum of the components other than the solvent (C) is preferably 15% by mass, more preferably 20% by mass, still more preferably 25% by mass, and particularly preferably 30% by mass. The upper limit of the amount of the ion (1-1) blended is preferably 50% by mass, more preferably 45% by mass, still more preferably 40% by mass, and particularly preferably 35% by mass. When the amount of the ion (1-1) blended falls within the above range, more accurate and more favorable microfabrication of the resist pattern is enabled. One, or two or more kinds of the ion (1-1) may be used.

Ion (1-2)

The ion (1-2) is a monovalent cation represented by M⁺.

Examples of the monovalent cation represented by M⁺ include:

metal cations, e.g., alkali metal cations such as a sodium cation, a potassium cation and a lithium cation;

onium cations, e.g., ammonium cations such as $NH_4^+$ and a quaternary ammonium cation;

monovalent cations represented by the following formulae (G-1) to (G-3); and the like.

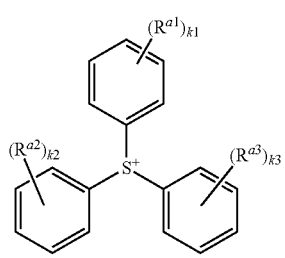

(G-1)

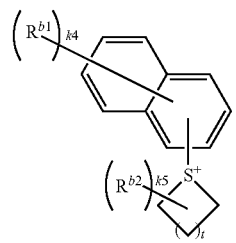

(G-2)

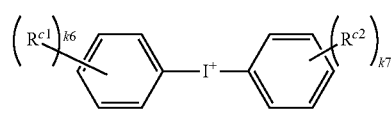

(G-3)

In the above formula (G-1), $R^{a1}$, $R^{a2}$ and $R^{a3}$ each independently represent a substituted or unsubstituted, linear or branched alkyl group having 1 to 12 carbon atoms, a substituted or unsubstituted aromatic hydrocarbon group having 6 to 12 carbon atoms, —$OSO_2$—$R^P$ or —$SO_2$—$R^Q$, or a ring structure constituted by combining at least two of these groups with each other, wherein $R^P$ and $R^Q$ each independently represent a substituted or unsubstituted, linear or branched alkyl group having 1 to 12 carbon atoms, a substituted or unsubstituted alicyclic hydrocarbon group having 5 to 25 carbon atoms, or a substituted or unsubstituted aromatic hydrocarbon group having 6 to 12 carbon atoms; and k1, k2 and k3 are each independently an integer of 0 to 5, wherein in a case in which $R^{a1}$ to $R^{a3}$, and $R^P$ and e are each present in a plurality of number, a plurality of each of $R^{a1}$s to $R^{a3}$s, and a plurality of each of $R^P$s and $R^Q$s are each identical or different with each other.

In the above formula (G-2), $R^{b1}$ represents a substituted or unsubstituted, linear or branched alkyl group having 1 to 8 carbon atoms, or a substituted or unsubstituted aromatic hydrocarbon group having 6 to 8 carbon atoms; and k4 is an integer of 0 to 7, wherein in a case in which $R^{b1}$ is present in a plurality of number, a plurality of $R^{b1}$s may be identical or different, and the plurality of $R^{b1}$s may taken together represent a ring structure constituted by combining with each other; $R^{b2}$ represents a substituted or unsubstituted, linear or branched alkyl group having 1 to 7 carbon atoms, or a substituted or unsubstituted aromatic hydrocarbon group having 6 or 7 carbon atoms; k5 is an integer of 0 to 6, wherein in a case in which $R^{b2}$ is present in a plurality of number, a plurality of $R^{b2}$s may be identical or different, and the plurality of $R^{b2}$s may taken together represent a ring structure constituted by combining with each other; and t is an integer of 0 to 3.

In the above formula (G-3), $R^{c1}$ and $R^{c2}$ each independently represent a substituted or unsubstituted, linear or branched alkyl group having 1 to 12 carbon atoms, a substituted or unsubstituted aromatic hydrocarbon group having 6 to 12 carbon atoms, —$OSO_2$—$R^R$ or —$SO_2$—$R^S$, or a ring structure constituted by combining at least two of these groups with each other, wherein $R^R$ and $R^S$ each independently represent a substituted or unsubstituted, linear or branched alkyl group having 1 to 12 carbon atoms, a substituted or unsubstituted alicyclic hydrocarbon group having 5 to 25 carbon atoms, or a substituted or unsubstituted aromatic hydrocarbon group having 6 to 12 carbon atoms; k6 and k7 each independently an integer of 0 to 5, wherein in a case in which $R^{c1}$, $R^{c2}$, $R^R$ and $R^S$ are each present in a plurality of number, a plurality of each of $R^{c1}$s, $R^{c2}$s, $R^R$s and $R^S$s are each identical or different with each other.

Examples of the unsubstituted linear alkyl group which may be represented by $R^{a1}$ to $R^{a3}$, $R^{b1}$, $R^{b2}$, $R^{c1}$ and $R^{c2}$ include a methyl group, an ethyl group, a n-propyl group, a n-butyl group, and the like.

Examples of the unsubstituted branched alkyl group which may be represented by $R^{a1}$ to $R^{a3}$, $R^{b1}$, $R^{b2}$, $R^{c1}$ and $R^{c2}$ include an i-propyl group, an i-butyl group, a sec-butyl group, a t-butyl group, and the like.

Examples of the unsubstituted aromatic hydrocarbon group which may be represented by $R^{a1}$ to $R^{a3}$, $R^{c1}$ and $R^{c2}$ include aryl groups such as a phenyl group, a tolyl group, a xylyl group, a mesityl group and a naphthyl group; aralkyl groups such as a benzyl group and a phenethyl group; and the like.

Examples of the unsubstituted aromatic hydrocarbon group which may be represented by $R^{b1}$ and $R^{b2}$ include a phenyl group, a tolyl group, a benzyl group, and the like.

Examples of the substituent which may substitute for the hydrogen atom included in the alkyl group and the aromatic hydrocarbon group include halogen atoms such as a fluorine atom, a chlorine atom, a bromine atom and an iodine atom, a hydroxy group, a carboxy group, a cyano group, a nitro group, an alkoxy group, an alkoxycarbonyl group, an alkoxycarbonyloxy group, an acyl group, an acyloxy group, and the like. Of these, a halogen atom is preferred, and a fluorine atom is more preferred.

$R^{a1}$ to $R^{a3}$, $R^{b1}$, $R^{b2}$, $R^{c1}$ and $R^{c2}$ represent preferably an unsubstituted linear or branched alkyl group, a fluorinated alkyl group, an unsubstituted monovalent aromatic hydrocarbon group, —$OSO_2$—R" or —$SO_2$—R", more preferably a fluorinated alkyl group or an unsubstituted monovalent aromatic hydrocarbon group, and still more preferably a fluorinated alkyl group. R" represents preferably an unsubstituted monovalent alicyclic hydrocarbon group or an unsubstituted monovalent aromatic hydrocarbon group.

Examples of the ring structure constituted by combining at least two of the groups of $R^{a1}$, $R^{a2}$ and $R^{a3}$ in the above formula (G-1) with each other, the ring structure constituted by combining a plurality of $R^{b1}$s in the above formula (G-2) with each other, and the ring structure constituted by combining at least two of the groups of $R^{c1}$ and $R^{c2}$ in the above formula (G-3) with each other include:

alicyclic structures such as a cyclopentane structure, a cyclohexane structure, a cyclooctane structure, a norbornane structure, a cyclopentene structure, a cyclohexene structure and a cyclooctene structure;

aromatic ring structures such as a benzene structure and a naphthalene structure; and the like. Of these, aromatic ring structures are preferred, and a benzene structure is more preferred.

In the above formula (G-1), k1, k2 and k3 are preferably an integer of 0 to 2, more preferably 0 and 1, and still more preferably 0. In the above formula (G-2), k4 is preferably an integer of 0 to 2, more preferably 0 and 1, and still more preferably 1. k5 is preferably an integer of 0 to 2, more preferably 0 and 1, and still more preferably 0. In the above formula (G-3), k6 and k7 are preferably an integer of 0 to 2, more preferably 0 and 1, and still more preferably 0.

The ion (1-2) is preferably a cation represented by the above formula (G-1), and more preferably a triphenylsulfonium cation, a 4-cyclohexyl sulfonylphenyldiphenylsulfonium cation, a 4-t-butylphenyldiphenylsulfonium cation, a 4-t-butylphenyldinaphthylsulfonium cation, a 4-t-butylphenylnaphthylbiphenylsulfonium cation and a tri(4-methoxyethoxyphenyl)sulfonium cation.

The lower limit of the amount of the ion (1-2) blended with respect to the sum of the components other than the solvent (C) is preferably 15% by mass, more preferably 20% by mass, still more preferably 25% by mass, and particularly preferably 30% by mass. The upper limit of the amount of the ion (1-2) blended is preferably 50% by mass, more preferably 45% by mass, still more preferably 40% by mass, and particularly preferably 35% by mass. When the amount of the ion (1-2) blended falls within the above range, more accurate and more favorable microfabrication of the resist pattern is enabled. One, or two or more kinds of the ion (1-2) may be used.

Ion (2-1)

The ion (2-1) is represented by the following formula (2-1).

$$R^3-SO_3^- \quad (2\text{-}1)$$

In the above formula (2-1), $R^3$ represents a monovalent organic group having 1 to 30 carbon atoms.

Examples of the monovalent organic group having 1 to 30 carbon atoms represented by $R^3$ include the groups similar to those exemplified in connection with the monovalent organic group having 1 to 30 carbon atoms which may be represented by $R^1$ in the above formula (1-1), and the like.

$R^3$ are preferably an organic group that does not include a fluorine atom, more preferably a hydrocarbon group, still more preferably a chain hydrocarbon group and an aromatic hydrocarbon group, particularly preferably an alkenyl group and an aryl group, and yet particularly preferably a vinyl group and a tolyl group.

The ion (2-1) is preferably a vinylsulfonate anion, an allyl sulfonate anion, a benzenesulfonate anion and a p-toluenesulfonate anion, and more preferably a vinylsulfonate anion and a p-toluenesulfonate anion.

The lower limit of the amount of the ion (2-1) blended with respect to the sum of the components other than the solvent (C) is preferably 5% by mass, more preferably 10% by mass, still more preferably 15% by mass, and particularly preferably 20% by mass. The upper limit of the amount of the ion (2-1) blended is preferably 70% by mass, more preferably 60% by mass, still more preferably 50% by mass, and particularly preferably 40% by mass. When the amount of the ion (2-1) blended falls within the above range, more accurate and more favorable microfabrication of the resist pattern is enabled. One, or two or more kinds of the ion (2-1) may be used.

Ion (2-2)

The ion (2-2) is a proton ($H^+$).

The lower limit of the amount of the ion (2-2) blended with respect to the sum of the components other than the solvent (C) is preferably 0.05% by mass, more preferably 0.1% by mass, still more preferably 0.15% by mass, and particularly preferably 0.2% by mass. The upper limit of the amount of the ion (2-2) blended is preferably 1.0% by mass, more preferably 0.8% by mass, still more preferably 0.6% by mass, and particularly preferably 0.4% by mass. When the amount of the ion (2-2) blended falls within the above range, more accurate and more favorable microfabrication of the resist pattern is enabled.

The lower limit of the total amount of the ions (1-1), (1-2), (2-1) and (2-2) blended with respect to the sum of the components other than the solvent (C), is 50% by mass, preferably 60% by mass, more preferably 70% by mass, still more preferably 80% by mass, and particularly preferably 90% by mass. The upper limit of the total amount of the ions blended is preferably 100% by mass, more preferably 99% by mass, and particularly preferably 95% by mass. When the total amount of the ions blended falls within the above range, it is considered that the acid (a) corresponding to the ion (1-1) can be properly generated therefrom, and consequently, more accurate and more favorable microfabrication of the resist pattern would be enabled.

(C) Solvent

The composition for resist pattern-refinement contains the solvent (C). The solvent (C) is not particularly limited as long as the ions (1-1), (1-2), (2-1) and (2-2), and optional component(s) can be dissolved or dispersed therein, without dissolving the resist pattern.

The solvent (C) is preferably water, a monovalent alcohol having 1 to 12 carbon atoms, an ether that includes an alkyl group having 1 to 10 carbon atoms, a linear, branched or cyclic saturated hydrocarbon having 6 to 12 carbon atoms, an aromatic hydrocarbon or a terpene compound.

Examples of the monovalent alcohol having 1 to 12 carbon atoms include 1-propanol, isopropyl alcohol, 1-butanol, 2-butanol, t-butyl alcohol, 1-pentanol, 2-pentanol, 3-pentanol, 2-methyl-1-butanol, 3-methyl-1-butanol, 3-methyl-2-butanol, 1-hexanol, 2-hexanol, 3-hexanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 1-heptanol, 2-heptanol, 2-methyl-2-heptanol, 2-methyl-3-heptanol, and the like. Of these, alcohols derived from linear or branched alkyl having 1 to 12 carbon atoms are preferred, and alcohols derived from linear or branched alkyl having 1 to 8 carbon atoms are more preferred.

Examples of the ether that includes an alkyl group having 1 to 10 carbon atoms include dipropyl ether, diisopropyl ether, butyl methyl ether, butyl ethyl ether, butyl propyl ether, dibutyl ether, diisobutyl ether, tert-butyl methyl ether, tert-butyl ethyl ether, tert-butyl propyl ether, di-tert-butyl ether, dipentyl ether, diisoamyl ether, cyclopentyl methyl ether, cyclohexyl methyl ether, cyclopentyl ethyl ether, cyclohexyl ethyl ether, cyclopentyl propyl ether, cyclopentyl-2-propyl ether, cyclohexyl propyl ether, cyclohexyl-2-propyl ether, cyclopentyl butyl ether, cyclopentyl-tert-butyl ether, cyclohexyl butyl ether, cyclohexyl tert-butyl ether, and the like.

Examples of the linear, branched or cyclic saturated hydrocarbon having 6 to 12 carbon atoms include octane, isooctane, nonane, decane, methylcyclohexane, decalin, and the like.

Examples of the aromatic hydrocarbon include xylene, amylbenzene, ethylbenzene, diethylbenzene, cumene, sec-butylbenzene, and the like.

Examples of the terpene compound include cymene, dipentene, and the like.

Of these, the solvent (C) is preferably a monovalent alcohol having 1 to 12 carbon atoms, more preferably a monovalent alcohol having 4 to 8 carbon atoms, and still more preferably 4-methyl-2-pentanol.

The solvent (C) may include other solvent except for the exemplary solvents described above. Examples of the other solvent include:

cyclic ethers such as tetrahydrofuran and dioxane;

alkyl ethers of a polyhydric alcohol such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether and propylene glycol monoethyl ether;

alkyl ether acetates of a polyhydric alcohol such as ethylene glycol ethyl ether acetate, diethylene glycol ethyl ether acetate, propylene glycol ethyl ether acetate and propylene glycol monomethyl ether acetate;

aromatic hydrocarbons such as toluene;

ketones such as acetone, methyl ethyl ketone, methyl isobutyl ketone, cyclohexanone, 4-hydroxy-4-methyl-2-pentanone and diacetone alcohol;

esters such as ethyl acetate, butyl acetate, ethyl 2-hydroxypropionate, ethyl 2-hydroxy-2-methylpropionate, ethyl ethoxyacetate, ethyl hydroxyacetate, 2-hydroxy-3-methylmethyl butanoate, methyl 3-methoxypropionate, ethyl 3-methoxypropionate, ethyl 3-ethoxypropionate, methyl 3-ethoxypropionate, ethyl acetate and butyl acetate; and the like.

Of these, cyclic ethers, alkyl ethers of a polyhydric alcohol, alkyl ether acetates of a polyhydric alcohol, ketones and esters are preferred.

The upper limit of the percentage content of the other solvent in the solvent (C) is preferably 30% by mass, and more preferably 20% by mass. When the percentage content of the other solvent falls within the above range, more accurate and more favorable microfabrication of the resist pattern is enabled.

The lower limit of the content of the solvent (C) is typically 95% by mass, and preferably 97% by mass.

Optional Components

The composition for resist pattern-refinement may contain optional component(s) other than the ions (1-1) to (2-2). The optional component is exemplified by a surfactant, and the like.

Surfactant

The surfactant is a component for improving application properties, defoaming properties, levelling properties and the like of the composition for resist pattern-refinement.

Examples of the surfactant include commercially available fluorochemical surfactants such as trade names, BM-1000 and BM-1100 (both BM Chemie), Megafac F142D, Megafac F172, Megafac F173 and Megafac F183 (all Dainippon Ink and Chemicals, Incorporated), Fluorad FC-135, Fluorad FC-170C, Fluorad FC-430 and Fluorad FC-431 (all Sumitomo 3M Limited), Surflon S-112, Surflon S-113, Surflon S-131, Surflon S-141 and Surflon S-145 (all Asahi Glass Co., Ltd.), SH-28PA, SH-190, SH-193, SZ-6032 and SF-8428 (all Dow Corning Toray Silicone Co., Ltd.), and the like.

The content of the surfactant is typically no greater than 5% by mass.

Preparation Method of Composition for Resist Pattern-Refinement

The composition for resist pattern-refinement may be prepared by mixing the ion (1-1), the ion (1-2), the ion (2-1) and the ion (2-2), and the solvent (C), as well as as needed, optional component(s). The composition for resist pattern-refinement is prepared by filtrating the mixture thus obtained with a filter or the like having a pore size of typically no greater than 0.2 µm, preferably no greater than 0.04 µm, and more preferably no greater than 0.01 µm. The material of the filter is for example, polyethylene, and the like. Examples of the commercially available product of the filter include a HDPE filter of Nippon Pall Corporation (pore size: 0.01 µm, 0.03 µm or 0.04 µm), and the like. The filtration method is exemplified by circulation filtration, and the like.

The ion (1-1) and the ion (1-2) are blended in the composition for resist pattern-refinement typically as a salt (hereinafter, may be also referred to as "(B) salt" or "salt (B)"). Also, the ion (2-1) and the ion (2-2) are blended in the composition for resist pattern-refinement typically as a sulfonic acid (hereinafter, may be also referred to as "(A) sulfonic acid" or "sulfonic acid (A)").

The composition for resist pattern-refinement prepared according to the formulation described above (hereinafter, may be also referred to as "composition for resist pattern-refinement (I)") contains the sulfonic acid (A), the salt (B)

and the solvent (C). The composition for resist pattern-refinement (I) may also contain optional components such as a surfactant, in addition to the components (A) to (C). The sulfonic acid (A) and the salt (B) of the composition for resist pattern-refinement (I) are explained below.

(A) Sulfonic Acid

The sulfonic acid (A) is constituted with the ion (2-1) and the ion (2-2). The sulfonic acid (A) is preferably a low molecular sulfonic acid. The term "low molecular" as referred to means that polymers are excluded. The low molecular sulfonic acid as referred to indicates that the sulfonic acid has a molecular weight of no greater than 1,000, preferably no greater than 500, and more preferably no greater than 300. When the sulfonic acid (A) has a low molecular weight, the composition for resist pattern-refinement can be more effectively impregnated into the surface layer of the resist pattern, and thus further microfabrication of the resist pattern is enabled.

The sulfonic acid (A) is exemplified by a compound represented by the following formula (2), and the like.

$$R^3-SO_3H \qquad (2)$$

In the above formula (2), $R^3$ is as defined in the above formula (2-1).

Examples of the sulfonic acid (A) include methanesulfonic acid, ethanesulfonic acid, taurine, 3-[(1,1-dimethyl-2-hydroxyethyl)amino]-2-hydroxy-1-propanesulfonic acid, 3-[bis(2-hydroxyethyl)amino]-2-hydroxy-1-propanesulfonic acid, (1R)-(−)-10-camphor sulfonic acid, (1S)-(+)-10-camphor sulfonic acid, trifluoromethanesulfonic acid, perfluorobutanesulfonic acid, perfluorooctanesulfonic acid, (methylamino)sulfonic acid, (butylamino)sulfonic acid, 1,1,2,2-tetrafluoro-2-(tetracyclo[6.2.1.1$^{3,6}$.0$^{2,7}$]dodecan-8-yl)ethanesulfonic acid, 1,1-difluoro-2-(tetracyclo[6.2.1.1$^{3,6}$.0$^{2,7}$]dodecan-8-yl)ethanesulfonic acid, vinylsulfonic acid, allylsulfonic acid, 2-(meth)acrylamide-2-methyl-1-propanesulfonic acid, 4-vinyl-1-benzenesulfonic acid, 6-(adamantan-1-ylcarbonyloxy)-1,1,2,2-tetrafluorohexane-1-sulfonic acid, 2-(adamantan-1-yl)-1,1-difluoroethane-1-sulfonic acid, nonafluoro-n-butanesulfonic acid, p-toluenesulfonic acid, p-methylbenzylsulfonic acid, and the like.

Of these, the sulfonic acid (A) is preferably 6-(adamantan-1-ylcarbonyloxy)-1,1,2,2-tetrafluorohexane-1-sulfonic acid, 2-(adamantan-1-yl)-1,1-difluoroethane-1-sulfonic acid, nonafluoro-n-butanesulfonic acid, p-toluenesulfonic acid, vinylsulfonic acid, 10-camphor sulfonic acid and p-methylbenzyl sulfonic acid, and vinylsulfonic acid and p-toluenesulfonic acid are more preferred. One, or two or more kinds of the sulfonic acid (A) may be used.

The lower limit of the amount of the sulfonic acid (A) blended with respect to the sum of the components other than the solvent (C) in the composition for resist pattern-refinement is preferably 5% by mass, more preferably 10% by mass, still more preferably 15% by mass, and particularly preferably 20% by mass. The upper limit of the amount of the sulfonic acid (A) blended is preferably 70% by mass, more preferably 60% by mass, still more preferably 50% by mass, and particularly preferably 40% by mass.

The lower limit of the amount of the sulfonic acid (A) blended with respect to the sum of the components other than the solvent (C) in the composition for resist pattern-refinement is preferably 20 mol %, more preferably 30 mol %, and still more preferably 40 mol %. The upper limit of the amount of the sulfonic acid (A) blended is preferably 80 mol %, more preferably 70 mol %, and still more preferably 60 mol %. The number of moles of the components other than the solvent (C) as referred to means the number of moles in terms of the compound of the component.

When the amount of the sulfonic acid (A) blended falls within the above range, more accurate and more favorable microfabrication of the resist pattern is enabled.

(B) Salt

The salt (B) is constituted from the ion (1-1) and the ion (1-2). The salt (B) can typically exchange a cation with the sulfonic acid (A). The expression that "can exchange the cation" as referred to means that the ion (1-2) that is a cation constituting the salt (B), and the ion (2-2) that is the proton constituting the sulfonic acid (A) are exchanged with one another such that the acid (a) derived from the ion (1-2) can be generated from the salt (B), whereas the salt of the sulfonic acid (A) can be generated therefrom.

The lower limit of the difference obtained by subtracting the pKa value (logarithmic value of the reciprocal number of the acid dissociation constant Ka) of the sulfonic acid (A) from the pKa of a conjugate acid of the ion (1-1) that is an anion (i.e., the pKa value of the acid (a) generated by exchanging the cation from the salt (B)) is preferably −2, more preferably −1.5, still more preferably −1.1, and particularly preferably −0.7. The upper limit of the difference is preferably 2, more preferably 1.6, still more preferably 1.3, and particularly preferably 1. When the difference falls within the above range, the degree of occurrence of the exchange of the cation increases, whereby generation of the acid (a) from the salt (B) is effectively caused, and as a result, more accurate and more favorable microfabrication of the resist pattern is enabled.

It is to be noted that in the embodiment of the present invention, the pKa value is determined at 298 K by the computation using for example, Calculator Plugins "Marvin Sketch" of ChemAxon Ltd.

The salt (B) is exemplified by a compound represented by the following formula (1), and the like.

$$R^1-Z-R^2-SO_3^-M^+ \qquad (1)$$

In the above formula (1), $R^1$, Z and $R^2$ are each as defined in the above formula (1-1); and $M^+$ is as defined in the above formula (1-2).

Examples of the salt (B) include the compounds represented by the following formulae, and the like.

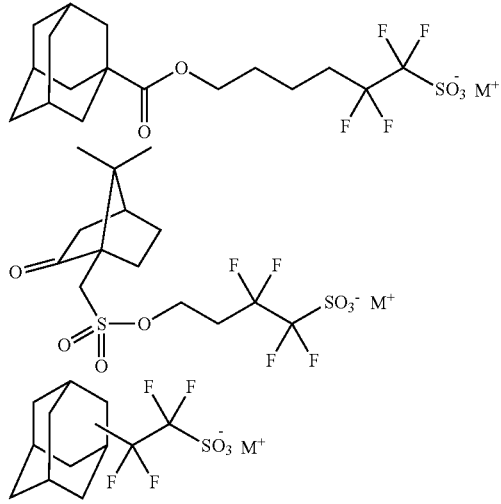

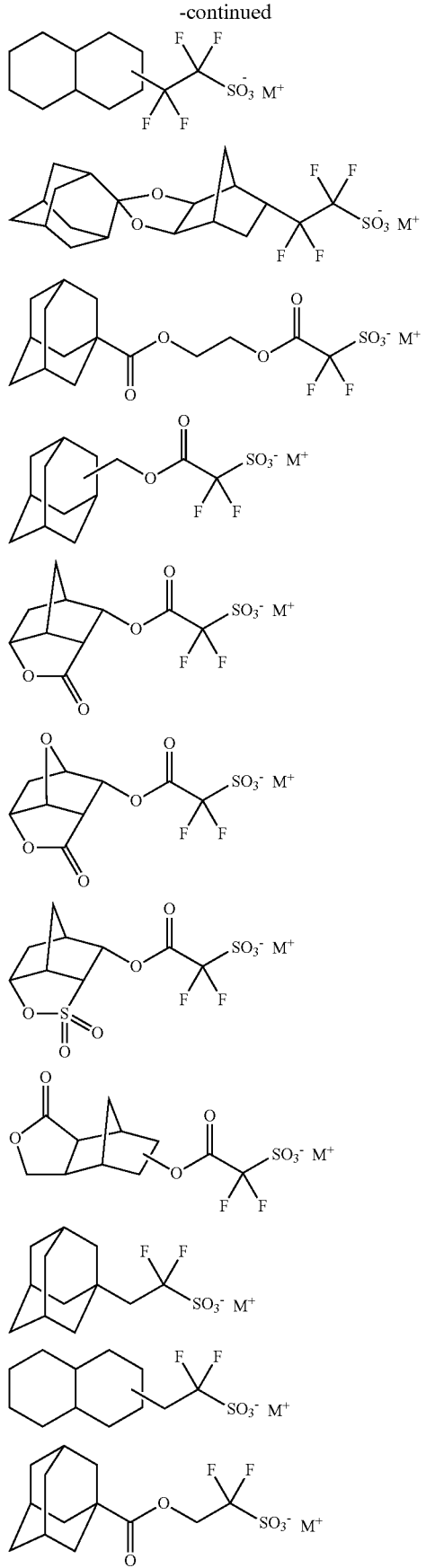
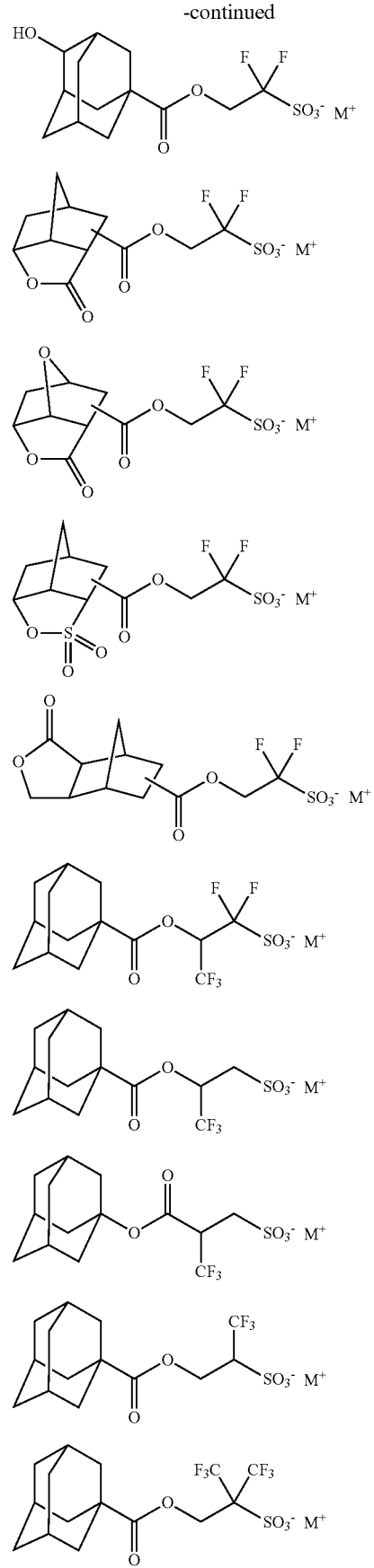

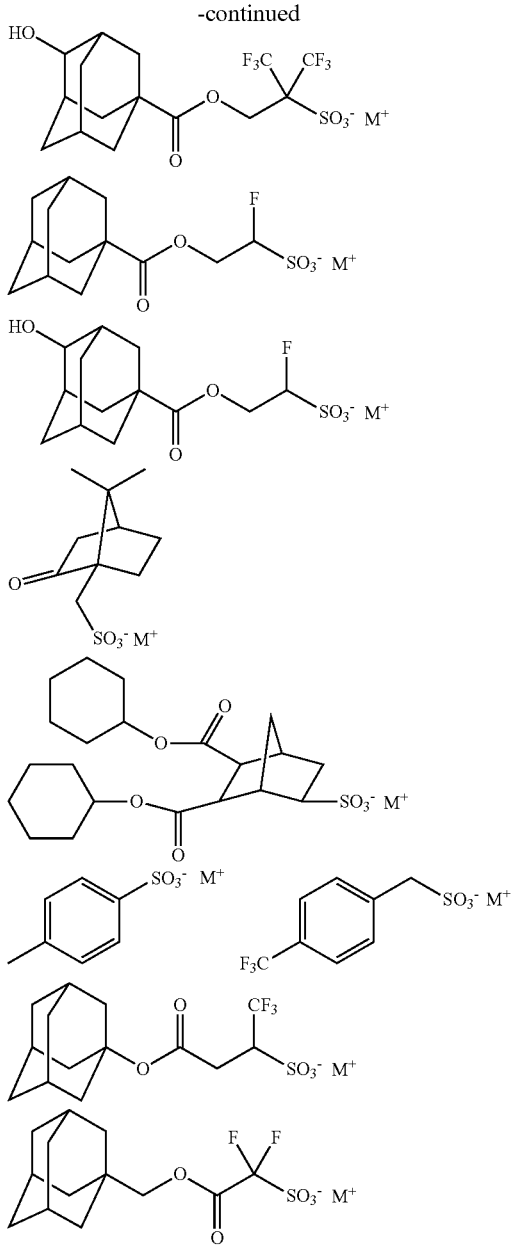

In the above formula, M⁺ represents a monovalent cation.

Of these, the salt (B) is preferably a salt that includes a 2-(adamantan-1-yl)-1,1-difluoroethane-1-sulfonate anion, a salt that includes a 6-(adamantan-1-ylcarbonyloxy)-1,1,2,2-tetrafluorohexane-1-sulfonate anion, a salt that includes a 2-(adamantan-1-yloxycarbonyl)-3,3,3-trifluoropropane-1-sulfonate anion, a salt that includes a 3-(adamantan-1-yloxycarbonyl)-1,1,1-trifluoropropane-2-sulfonate anion, a salt that includes a 2-(adamantan-1-ylcarbonyloxy)-3,3,3-trifluoropropane-1-sulfonate anion, a salt that includes a 5,6-di(cyclohexyloxycarbonyl)norbornane-2-sulfonate anion, a salt that includes a nonafluoro-n-butane-1-sulfonate anion and a salt that includes an adamantan-1-ylmethoxycarbonyl-1,1-difluoromethanesulfonate anion, and is more preferably a salt that includes any of these triphenylsulfonium cations, a salt that includes any of these 4-cyclohexylsulfonylphenyl-diphenylsulfonium cations, a salt that includes any of these 4-t-butylphenyldiphenylsulfonium cations, a salt that includes any of these 4-t-butylphenyldinaphthylsulfonium cations, a salt that includes any of these 4-t-butylphenylnaphthylbiphenylsulfonium cations, and a salt that includes any of these tri(4-methoxyethoxyethylphenyl)sulfonium cations.

The lower limit of the amount of the salt (B) blended with respect to the sum of the components other than the solvent (C) in the composition for resist pattern-refinement is preferably 30% by mass, more preferably 40% by mass, still more preferably 50% by mass, and particularly preferably 60% by mass. The upper limit of the amount of the salt (B) blended is preferably 95% by mass, more preferably 90% by mass, still more preferably 85% by mass, and particularly preferably 80% by mass.

The lower limit of the amount of the salt (B) blended with respect to the sum of the components other than the solvent (C) in the composition for resist pattern-refinement is preferably 20 mol %, more preferably 30 mol %, still more preferably 40 mol %, and particularly preferably 45 mol %. The upper limit of the amount of the salt (B) blended is preferably 80 mol %, more preferably 70 mol %, still more preferably 60 mol %, and particularly preferably 55 mol %.

When the amount of the salt (B) blended falls within the above range, more accurate and more favorable microfabrication of the resist pattern is enabled.

The lower limit of the total amount of the sulfonic acid (A) and the salt (B) blended with respect to the sum of the components other than the solvent (C) in the composition for resist pattern-refinement is typically 50% by mass, preferably 60% by mass, more preferably 70% by mass, still more preferably 80% by mass, and particularly preferably 90% by mass. The upper limit of the total amount of of the sulfonic acid (A) and the salt (B) blended is not particularly limited, and preferably 100% by mass, more preferably 99% by mass and still more preferably 95% by mass.

When the total amount of the sulfonic acid (A) and the salt (B) blended falls within the above range, it is considered that the acid corresponding to the salt (B) can be properly generated therefrom, and consequently, accurate and favorable microfabrication of a resist pattern would be enabled.

Fine Pattern-Forming Method

The fine pattern-forming method includes the steps of: forming a resist pattern (hereinafter, may be also referred to as "resist pattern formation step"); and refining the resist pattern with a composition for resist pattern-refinement (hereinafter, may be also referred to as "refining step"). In the fine pattern-forming method, the composition for resist pattern-refinement described above is used as the composition for resist pattern-refinement. According to the fine pattern-forming method, accurate and favorable microfabrication of a resist pattern is enabled. Each step is explained below.

Resist Pattern Formation Step

In this step, a resist pattern is formed. The procedure for forming the resist pattern is not particularly limited, and it is preferred that the resist pattern is formed from a radiation-sensitive resin composition (hereinafter, may be also referred to as "radiation-sensitive resin composition (I)") containing a polymer having an acid-labile group (hereinafter, may be also referred to as "(a) polymer" or "polymer (a)") and a radiation-sensitive acid generator (hereinafter, may be also referred to as "(b) acid generator" or "acid generator (b)"). When the resist pattern is thus formed, the composition for resist pattern-refinement enables more accurate and more favorable microfabrication of the resist pattern.

The resist pattern formation step in which the radiation-sensitive resin composition (I) is used includes the substeps of: providing a resist film with the radiation-sensitive resin composition (I) (hereinafter, may be also referred to as "resist film-providing step"), exposing the resist film (hereinafter, may be also referred to as "exposure step"), and developing the resist film exposed (hereinafter, may be also referred to as "development step"). Each step is explained below.

Resist Film-Providing Step

In this step, the resist film is provided by using the radiation-sensitive resin composition (I). This radiation-sensitive resin composition (I) is as described later. Examples of the substrate on which the resist film is provided include conventionally well-known substrates such as a silicon wafer, a wafer covered with silicon dioxide or aluminum, and the like. In addition, an organic or inorganic antireflective film may be also provided on the substrate, which is disclosed in, for example, Japanese Examined Patent Application, Publication No. H6-12452 and Japanese Unexamined Patent Application, Publication No. S59-93448, and the like. The application process may include, for example, spin coating, cast coating, roll coating, and the like. After the application, prebaking (PB) may be carried out as needed for the purpose of volatilizing the solvent in the coating film. The lower limit of the temperature of PB is preferably 60° C., and more preferably 80° C. The upper limit of the temperature of PB is preferably 140° C., and more preferably 120° C. The lower limit of the time period of PB is preferably 5 sec, and more preferably 10 sec. The upper limit of the time period of PB is preferably 600 sec, and more preferably 300 sec. The lower limit of the average thickness of the resist film formed is preferably 10 nm, and more preferably 20 nm. The upper limit of the average thickness of the resist film is preferably 1,000 nm, and more preferably 500 nm.

In order to prevent influences from basic impurities, etc., included in an environmental atmosphere, a protective film may be provided on the resist film as disclosed in, for example, Japanese Unexamined Patent Application, Publication No. H5-188598 and the like. Furthermore, in order to prevent an outflow of the acid generator, etc., from the resist film, a protective film for liquid immersion may be also provided on the resist film as disclosed in, for example, Japanese Unexamined Patent Application, Publication No. 2005-352384 and the like. It is to be noted that these techniques may be employed in combination.

Exposure Step

In this step, the resist film provided in the resist film-providing step is exposed by irradiating with exposure light through a photomask, or the like. The exposure light is exemplified by, depending on the line width of the intended pattern, for example, electromagnetic radiations such as a visible light ray, an ultraviolet ray, a far ultraviolet ray, an extreme ultraviolet ray (13.5 nm, EUV), an X-ray and a γ-ray; charged particle rays such as an electron beam and an α-ray; and the like. Of these, a far ultraviolet ray, EUV and an electron beam are preferred, an ArF excimer laser beam (wavelength: 193 nm), a KrF excimer laser beam (wavelength: 248 nm), EUV and an electron beam are more preferred, and an ArF excimer laser beam, EUV and an electron beam are even more preferred.

When the exposure is executed through a liquid for immersion lithography, the liquid immersion liquid used is exemplified by water, a fluorine-containing inert liquid, and the like. It is preferred that the liquid immersion liquid is transparent to the exposure wavelength, and has a temperature coefficient of the refractive index as small as possible such that distortion of an optical image projected onto the film is minimized. In particular, when an ArF excimer laser beam (wavelength: 193 nm) is used as an exposure light source, water is preferably used in light of its availability and ease of handling, in addition to the aforementioned respects. When water is used as the liquid immersion liquid, a slight amount of an additive may be added which reduces the surface tension of water and provides surfactant power. It is preferred that the additive hardly dissolves the resist film on the wafer and has a negligible influence on an optical coating of an inferior face of a lens. Distilled water is preferably used.

After the exposure, it is preferred that post exposure baking (PEB) is carried out to promote dissociation of the acid-labile group included in the polymer (a) and the like, by the acid generated from the acid generator (b) upon exposure at an exposed part of the resist film. This PEB leads to generation of the difference of the solubility in a developer solution between the light-exposed site and the light-unexposed site. The lower limit of the temperature of PEB is preferably 50° C., and more preferably 70° C. The upper limit of the temperature of PEB is preferably 180° C., and more preferably 130° C. The lower limit of the time period of PEB is preferably 5 sec, and more preferably 10 sec. The upper limit of the time period of PEB is preferably 600 sec, and more preferably 300 sec.

Development Step

In this step, the resist film exposed in the exposure step is developed using a developer solution. Accordingly, a predetermined resist pattern is formed. The developer solution may be, for example, an alkaline developer solution, or the like.

Examples of the alkaline developer solution include aqueous alkaline solutions prepared by dissolving at least one alkaline compound such as sodium hydroxide, potassium hydroxide, sodium carbonate, sodium silicate, sodium metasilicate, ammonia water, ethylamine, n-propylamine, diethylamine, di-n-propylamine, triethylamine, methyldiethylamine, ethyldimethylamine, triethanolamine, tetramethylammonium hydroxide (TMAH), pyrrole, piperidine, choline, 1,8-diazabicyclo-[5.4.0]-7-undecene and 1,5-diazabicyclo-[4.3.0]-5-nonene, and the like.

To the alkaline developer solution may be added, for example, an organic solvent. Specific examples of the organic solvent include one, or two or more kinds of the solvent exemplified in connection with the solvent (C) of the aforementioned composition for resist pattern-refinement, and the like. Of these, monovalent alcohols having 1 to 12 carbon atoms, cyclic ethers, esters, ketones, aromatic hydrocarbons, phenol, acetonyl acetone and dimethylformamide are preferred. One, or two or more kinds of the organic solvent may be used.

The proportion of the organic solvent used with respect to 100 parts by volume of the alkaline developer solution is preferably no greater than 100 parts by volume, and more preferably no greater than 50 parts by volume.

Also, to the developer solution may be added an appropriate amount of a surfactant as needed. As the surfactant, for example, an ionic, nonionic, fluorine, and/or silicon surfactant, etc., may be used.

Examples of the development method include: a dip method in which the substrate is immersed for a given time period in the developer solution charged in a container; a puddle method in which the developer solution is placed to form a dome-shaped bead by way of the surface tension on the surface of the substrate for a given time period to conduct a development; a spray method in which the developer solution is sprayed onto the surface of the substrate; a dynamic dispensing method in which the developer solution is continuously applied onto the substrate that is rotated at a constant speed while scanning with a developer solution-application nozzle at a constant speed; and the like.

After the development, it is preferred that a rinse agent such as water or an alcohol is used to rinse, followed by drying. The method for the rinsing is exemplified by: a spin-coating method in which the rinse agent is continuously applied onto the substrate that is rotated at a constant speed; a dipping method in which the substrate is immersed for a given time period in the rinse agent charged in a container; a spray method in which the rinse agent is sprayed onto the surface of the substrate; and the like.

Accordingly, a resist pattern 1 is obtained as shown in FIG. 1. The resist pattern thus obtained is then subjected to a refining treatment using the composition for resist pattern-refinement in the resist pattern-refining step.

Resist Pattern-Refining Step

In this step, the resist pattern obtained in the resist pattern formation step is refined with the composition for resist pattern-refinement. This step can be carried out by, for example: applying the composition for resist pattern-refinement on the resist pattern; baking; subjecting to a development; washing; and the like.

Figure 2:
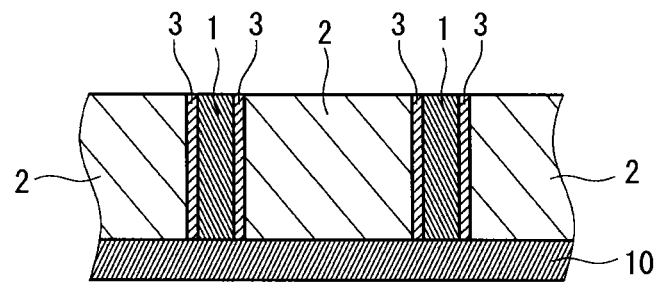
FIG. 2 shows a cross sectional view illustrating one example of a state after applying a composition for resist pattern-refinement, and baking.
Figure 3:
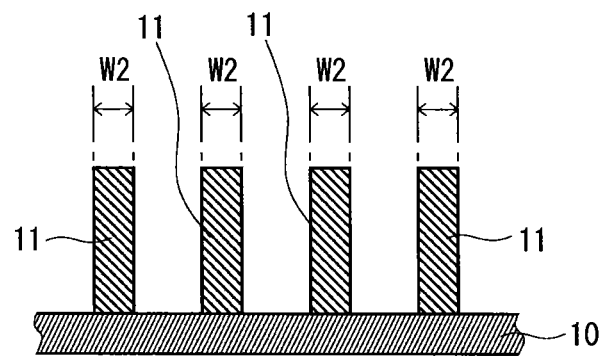
FIG. 3 shows a cross sectional view illustrating one example of a state after refining a resist pattern.

This step is illustrated by way of FIGS. 2 and 3. First, as shown in FIG. 2, the composition for resist pattern-refinement 2 is applied by a conventionally well-known method such as spin coating on a substrate 10 having the resist pattern 1 formed thereon. Thereafter, baking is carried out to diffuse the acid from the composition for resist pattern-refinement 2 to the resist pattern 1, thereby allowing the acid-labile group of the polymer constituting the resist pattern on the surface layer of the resist pattern 1 to be dissociated by the acid formed on the surface layer of the resist pattern 1 to form an alkali-solubilizable layer 3. The thickness of the alkali-solubilizable layer 3 can be adjusted with 2 the types, baking temperatures and baking time periods and the like of the composition for resist pattern-refinement 2 and the radiation-sensitive resin composition.

As a method for applying the composition for resist pattern-refinement 2, a spin coating method, etc., may be employed, i.e., the composition for resist pattern-refinement 2 is spin-coated on the resist pattern 1 formed, at a desired rotation frequency. It is to be noted that the spin coating enables excess composition for resist pattern-refinement 2 to be removed. The lower limit of the rotation frequency of the spin coating is preferably 10 rpm, and more preferably 20 rpm. The upper limit of the rotation frequency is preferably 5,000 rpm, and more preferably 2,000 rpm. Whereas, although the spin-coating time period is not particularly limited, the lower limit of the spin-coating time period is preferably 1 sec, and more preferably 5 sec. The upper limit of the spin-coating time period is preferably 200 sec, and more preferably 120 sec.

The lower limit of the baking temperature is preferably 50° C., more preferably 70° C., still more preferably 80° C., and particularly preferably 90° C. The upper limit of the baking temperature is preferably 180° C., more preferably 150° C., still more preferably 130° C., and particularly preferably 110° C. The lower limit of the baking time period is preferably 60 sec, and more preferably 70 sec. The upper limit of the baking time period is preferably 120 sec, and more preferably 100 sec. It is to be noted that cooling may be conducted at 23° C. for about 30 sec after the baking.

After the baking, a development is carried out with an alkaline developer solution such as an aqueous TMAH solution so as to dissolve and remove the alkali-solubilizable layer 3. Finally, washing with water or the like can permit formation of a refined resist pattern 11 having a line width of W2 (W1>W2) as shown in FIG. 3, for example. The development time period is, for example, 60 sec to 120 sec.

According to the fine pattern-forming method, a fine resist pattern of, for example, no greater than 50 nm can be formed, out of the limitation with an ArF exposure device and of the exposure wavelength.

Radiation-Sensitive Resin Composition

The radiation-sensitive resin composition (I) contains the polymer (a), and the acid generator (b). It is preferred that the radiation-sensitive resin composition (I) further contains (c) an acid diffusion controller and (d) a solvent. Hereinafter, each component will be explained.

(a) Polymer

The polymer (a) has an acid-labile group. The "acid-labile group" as referred to means a group that substitutes for a hydrogen atom of a carboxy group, a phenolic hydroxyl group and the like, and is dissociated by the action of an acid. In addition to a structural unit (I) that includes the acid-labile group, the polymer (a) may also have a structural unit (II) that includes a polar group, and also other structural unit except for the structural units (I) and (II). The polymer (a) may have either one, or two or more types of each structural unit. Hereinafter, each structural unit is explained.

Structural Unit (I)

The structural unit (I) includes an acid-labile group. Examples of the structural unit (I) include a structural unit represented by the following formula (3-1) (hereinafter, may be also referred to as "structural unit (I-1)"), a structural unit represented by the following formula (3-2) (hereinafter, may be also referred to as "structural unit (I-2)"), and the like.

(3-1)

(3-2)

In the above formula (3-1), $R^4$ represents a hydrogen atom, a fluorine atom, a methyl group or a trifluoromethyl group; and $Y^1$ represents a monovalent acid-labile group.

In the above formula (3-2), $R^5$ represents a hydrogen atom or a methyl group; and $Y^2$ represents a monovalent acid-labile group.

In light of the copolymerizability of a monomer that gives the structural unit (I-1), $R^4$ represents preferably a hydrogen atom or a methyl group, and more preferably a methyl group.

The monovalent acid-labile group represented by $Y^1$ is preferably a group represented by the following formula (Y-1).

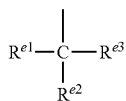

(Y-1)

In the above formula (Y-1), $R^{e1}$ represents a monovalent chain hydrocarbon group having 1 to 10 carbon atoms, a monovalent alicyclic hydrocarbon group having 3 to 20 carbon atoms or a monovalent aromatic hydrocarbon group having 6 to 20 carbon atoms; $R^{e2}$ and $R^{e3}$ each independently represent a monovalent chain hydrocarbon group having 1 to 10 carbon atoms or a monovalent alicyclic hydrocarbon group having 3 to 20 carbon atoms, or these groups may taken together represent an alicyclic structure having 3 to 20 ring atoms together with the carbon atom to which $R^{e2}$ and $R^{e3}$ bond.

Exampled of the monovalent chain hydrocarbon group having 1 to 10 carbon atoms which may be represented by $R^{e1}$, $R^{e2}$ and $R^{e3}$ include:

alkyl groups such as a methyl group, an ethyl group, a n-propyl group, an i-propyl group, a n-butyl group, an i-butyl group, a sec-butyl group, a t-butyl group and a n-pentyl group;

alkenyl groups such as an ethenyl group, a propenyl group, a butenyl group and a pentenyl group;

alkynyl groups such as an ethynyl group, a propynyl group, a butynyl group and a pentynyl group; and the like.

Of these, alkyl groups are preferred, alkyl groups having 1 to 4 carbon atoms are more preferred, a methyl group, an ethyl group and an i-propyl group are still more preferred, and an ethyl group is particularly preferred.

Examples of the monovalent alicyclic hydrocarbon group having 3 to 20 carbon atoms which may be represented by $R^{e1}$, $R^{e2}$ and $R^{e3}$ include:

monocyclic cycloalkyl groups such as a cyclopropyl group, a cyclobutyl group, a cyclopentyl group, a cyclohexyl group and a cyclooctyl group;

polycyclic cycloalkyl groups such as a norbornyl group, an adamantyl group, a tricyclodecyl group and a tetracyclododecyl group;

monocyclic cycloalkenyl groups such as a cyclopropenyl group, a cyclobutenyl group, a cyclopentenyl group and a cyclohexenyl group;

polycyclic cycloalkenyl groups such as a norbornenyl group and a tricyclodecenyl group; and the like. Of these, monocyclic cycloalkyl groups and polycyclic cycloalkyl groups are preferred, and a cyclopentyl group, a cyclohexyl group, a norbornyl group and an adamantyl group are more preferred.

Examples of the monovalent aromatic hydrocarbon group having 6 to 20 carbon atoms which may be represented by $R^{e1}$ include:

aryl groups such as a phenyl group, a tolyl group, a xylyl group, a mesityl group, a naphthyl group, a methylnaphthyl group, an anthryl group and a methylanthryl group;

aralkyl groups such as a benzyl group, a phenethyl group, a naphthylmethyl group and an anthryl methyl group; and the like.

Examples of the alicyclic structure having 3 to 20 ring atoms taken together represented by these groups together with the carbon atom to which these bond include:

monocyclic cycloalkane structures such as a cyclopropane structure, a cyclobutane structure, a cyclopentane structure, a cyclohexane structure and a cyclooctane structure;

polycyclic cycloalkane structures such as a norbornane structure, an adamantane structure, a tricyclodecane structure and a tetracyclododecane structure;

monocyclic cycloalkene structures such as a cyclopropene structure, a cyclobutene structure, a cyclopentene structure, a cyclohexene structure and a cyclooctene structure;

polycyclic cycloalkene structures such as a norbornene structure, a tricyclodecene structure and a tetracyclododecene structure; and the like.

Of these, monocyclic cycloalkane structures and polycyclic cycloalkane structures are preferred, monocyclic cycloalkane structures having 5 to 8 carbon atoms and polycyclic cycloalkane structures having 7 to 12 carbon atoms are more preferred, a cyclopentane structure, a cyclohexane structure, a cyclooctane structure, a norbornane structure and an adamantane structure are still more preferred, and a cyclopentane structure and an adamantane structure are particularly preferred.

In the group represented by the above formula (Y-1), it is preferred that: $R^{e1}$ represents a monovalent chain hydrocarbon group having 1 to 10 carbon atoms, and $R^{e2}$ and $R^{e3}$ taken together represent an alicyclic structure having 3 to 20 ring atoms together with the carbon atom to which $R^{e2}$ and $R^{e3}$ bond; and $R^{e1}$ represents a monovalent alicyclic hydrocarbon group having 3 to 20 carbon atoms, and $R^{e2}$ and $R^{e3}$ each represent a monovalent chain hydrocarbon group having 1 to 10 carbon atoms. In the group represented by the above formula (Y-1), it is more preferred that: $R^{e1}$ represents an alkyl group having 1 to 10 carbon atoms, and $R^{e2}$ and $R^{e3}$ taken together represent a cycloalkane structure having 3 to 20 ring atoms together with the carbon atom to which $R^{e2}$ and $R^{e3}$ bond; and $R^{e1}$ represents a cycloalkyl group having 3 to 20 carbon atoms, and $R^{e2}$ and $R^{e3}$ each represent an alkyl group having 1 to 10 carbon atoms. In the group represented by the above formula (Y-1), it is still more preferred that $R^{e1}$ represents an alkyl group having 1 to 4 carbon atoms, and $R^{e2}$ and $R^{e3}$ taken together represent a monocyclic cycloalkane structure having 5 to 8 ring atoms or a polycyclic cycloalkane structure having 7 to 12 ring atoms together with the carbon atom to which $R^{e2}$ and $R^{e3}$ bond. It is particularly preferred that the group represented by the above formula (Y-1) is a 1-ethyl-1-cyclopentyl group, a 2-ethyl-2-adamantyl group, a 2-methyl-2-adamantyl group and a 2-adamantyl-2-propyl group.

In light of the copolymerizability of the monomer that gives the structural unit (I-2), $R^5$ preferably represents a hydrogen atom.

The monovalent acid-labile group represented by $Y^2$ is preferably the group represented by the following formula (Y-2).

(Y-2)

In the above formula (Y-2), $R^{e4}$, $R^{e5}$ and $R^{e6}$ each independently represent a hydrogen atom, a monovalent chain hydrocarbon group having 1 to 20 carbon atoms, a monovalent alicyclic hydrocarbon group having 3 to 20 carbon atoms, an oxy chain hydrocarbon group having 1 to 20 carbon atoms or an oxyalicyclic hydrocarbon group having 3 to 20 carbon atoms, wherein at least one of $R^{e4}$, $R^{e5}$ and $R^{e6}$ does not represent a hydrogen atom.

Examples of the monovalent chain hydrocarbon group having 1 to 20 carbon atoms which may be represented by $R^{e4}$, $R^{e5}$ and $R^{e6}$ include:

alkyl groups such as a methyl group, an ethyl group, a n-propyl group, an i-propyl group, a n-butyl group, an i-butyl group, a sec-butyl group, a t-butyl group and a n-pentyl group;

alkenyl groups such as an ethenyl group, a propenyl group, a butenyl group and a pentenyl group;

alkynyl groups such as an ethynyl group, a propynyl group, a butynyl group and a pentynyl group, and the like.

Of these, alkyl groups are preferred, alkyl groups having 1 to 4 carbon atoms are preferred, a methyl group, an ethyl group and a n-propyl group are still more preferred, and a methyl group is particularly preferred.

Examples of the monovalent alicyclic hydrocarbon group having 3 to 20 carbon atoms which may be represented by $R^{e4}$, $R^{e5}$ and $R^{e6}$ include groups similar to those exemplified in connection with $R^{e1}$, $R^{e2}$ and $R^{e3}$, and the like.

Of these, monocyclic cycloalkyl groups and polycyclic cycloalkyl groups are preferred, and a cyclopentyl group, a cyclohexyl group, a norbornyl group and an adamantyl group are more preferred.

Examples of the monovalent oxy chain hydrocarbon group having 1 to 20 carbon atoms which may be represented by $R^{e4}$, $R^{e5}$ and $R^{e6}$ include:

alkoxy groups such as a methoxy group, an ethoxy group, a n-propoxy group, an i-propoxy group, a n-butoxy group, an i-butoxy group, a sec-butoxy group, a t-butoxy group and a n-pentyloxy group;

alkenyloxy groups such as an ethenyloxy group, a propenyloxy group, a butenyloxy group and a pentenyloxy group;

alkynyloxy groups such as an ethynyloxy group, a propynyloxy group, a butynyloxy group and a pentynyloxy group; and the like.

Of these, alkoxy groups are preferred, alkoxy groups having 1 to 4 carbon atoms are more preferred, and a methoxy group, an ethoxy group and a n-propoxy group are even more preferred.

Examples of the monovalent oxyalicyclic hydrocarbon group having 3 to 20 carbon atoms which may be represented by $R^{e4}$, $R^{e5}$ and $R^{e6}$ include:

monocyclic cycloalkyloxy groups such as a cyclopropyloxy group, a cyclobutyloxy group, a cyclopentyloxy group, a cyclohexyloxy group and a cyclooctyloxy group;

polycyclic cycloalkyloxy groups such as a norbornyloxy group, an adamantyloxy group, a tricyclodecyloxy group and a tetracyclododecyloxy group;

monocyclic cycloalkenyloxy groups such as a cyclopropenyloxy group, a cyclobutenyloxy group, a cyclopentenyloxy group and a cyclohexenyloxy group;

polycyclic cycloalkenyloxy groups such as a norbornenyloxy group and a tricyclodecenyloxy group, and the like.

Of these, monocyclic cycloalkyloxy groups and polycyclic cycloalkyloxy groups are preferred, and a cyclopentyloxy group, a cyclohexyloxy group, a norbornyloxy group and adamantyloxy group are more preferred.

In the group represented by the above formula (Y-2), it is preferred that: $R^{e4}$, $R^{e5}$ and $R^{e6}$ each represent a monovalent chain hydrocarbon group; $R^{e4}$ and $R^{e5}$ each represent a monovalent chain hydrocarbon group and $R^{e6}$ represents a monovalent oxy chain hydrocarbon group; and $R^{e4}$ represents a monovalent chain hydrocarbon group and $R^{e5}$ and $R^{e6}$ each represent a monovalent oxy chain hydrocarbon group. In the group represented by the above formula (Y-2), it is more preferred that: $R^{e4}$, $R^{e5}$ and $R^{e6}$ each represent an alkyl group; $R^{e4}$ and $R^{e5}$ each represent an alkyl group and $R^{e6}$ represents an alkoxy group; and $R^{e4}$ represents an alkyl group and $R^{e5}$ and $R^{e6}$ each represent an alkoxy group. In the group represented by the above formula (Y-2), it is even more preferred that $R^{e4}$, $R^{e5}$ and $R^{e6}$ each represent an alkyl group. The group represented by the above formula (Y-2) is particularly preferably a t-butyl group, a t-pentyl group, a t-hexyl group and t-heptyl group.

Examples of the structural unit (I) include:

structural units represented by the following formula (3-1-1) to (3-1-8) as the structural unit (I-1);

structural units represented by the following formula (3-2-1) to (3-2-3) as the structural unit (I-2), and the like.

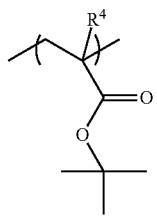

(3-1-1)

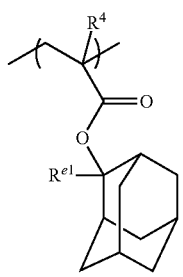

(3-1-2)

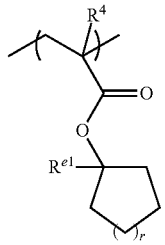

(3-1-3)

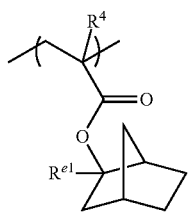

(3-1-4)

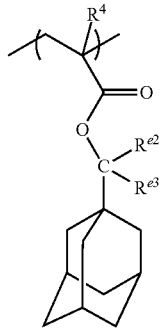

(3-1-5)

-continued (3-1-6)

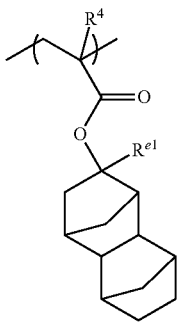

(3-1-7)

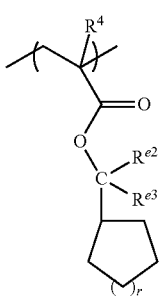

(3-1-8)

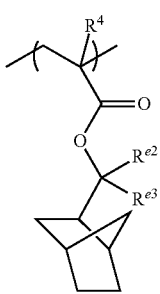

(3-2-1)

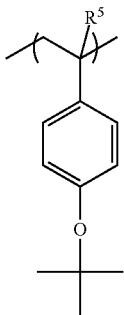

(3-2-2)

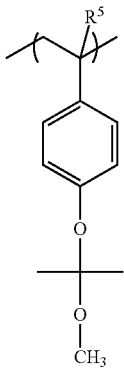

-continued (3-2-3)

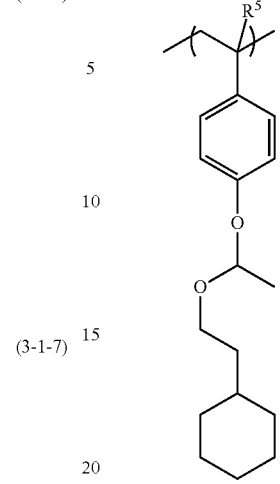

In the above formulae (3-1-1) to (3-1-8), $R^4$ is as defined in the above formula (3-1); $R^{e1}$, $R^{e2}$ and $R^{e3}$ are each as defined in the above formula (Y-1); and r each independently represents an integer of 1 to 3.

In the above formulae (3-2-1) to (3-2-3), $R^5$ is as defined in the above formula (3-2).

The structural unit (I) is preferably the structural unit (I-1), more preferably structural units represented by the above formulae (3-1-2), (3-1-3), (3-1-5) and (3-1-6), still more preferably a structural unit that includes a cyclopentane structure and a structural unit that includes an adamantane structure, and particularly preferably a structural unit derived from 1-ethyl-1-cyclopentyl (meth)acrylate, a structural unit derived from 2-ethyl-2-adamantyl (meth)acrylate, a structural unit derived from 2-methyl-2-adamantyl (meth)acrylate and a structural unit derived from 2-adamantyl-2-propyl (meth)acrylate.

The lower limit of the proportion of the structural unit (I) contained with respect to the total structural units constituting the polymer (a) is preferably 10 mol %, more preferably 20 mol %, still more preferably 25 mol %, and particularly preferably 30 mol %. The upper limit of the proportion of the structural unit (I) contained is preferably 90 mol %, more preferably 70 mol %, still more preferably 60 mol %, and particularly preferably 55 mol %. When the proportion of the structural unit (I) contained falls within the above range, lithography performances of the radiation-sensitive resin composition (I) can be further improved.

Structural Unit (II)

The structural unit (II) is a structural unit (hereinafter, may be also referred to as "structural unit (II-1)") represented by the following formula (4-1), a structural unit (hereinafter, may be also referred to as "structural unit (II-2)") represented by the following formula (4-2), or a combination of these. Owing to the polymer (a) having the structural unit (II), dispersibility of the acid generator (b) in the polymer (a) can be improved. As a result, the radiation-sensitive resin composition (I) enables the LWR performance and the like to be further improved. In addition, the resist pattern formed from the radiation-sensitive resin composition (I) can have improved adhesiveness to the substrate.

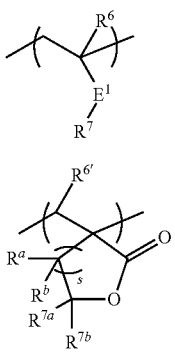

(4-1)

(4-2)

In the above formula (4-1), $R^6$ represents a hydrogen atom, a fluorine atom, a methyl group or a trifluoromethyl group; $E^1$ represents a single bond, —CO—O—, —CO—NH— or —CO—O—(CH$_2$)$_i$—CO—O—; "i" is an integer of 1 to 6; and $R^7$ represents an acid-nonlabile group that includes a polar group.

In the above formula (4-2), $R^{6'}$ represents a hydrogen atom or a methyl group; $R^a$ and $R^b$ each independently represent a hydrogen atom, a fluorine atom, a hydroxy group or a monovalent organic group; s is an integer of 1 to 3, wherein in a case where s is no less than 2, a plurality of $R^a$s may be identical or different with each other and a plurality of $R^b$s may be identical or different with each other; $R^{7a}$ and $R^{7b}$ each independently represent a hydrogen atom, a fluorine atom, a hydroxy group or a monovalent organic group.

In the structural unit (II-1), in light of the copolymerizability of a monomer that gives the structural unit (II-1), $R^6$ represents preferably a hydrogen atom or a methyl group, and more preferably a methyl group.

In light of the copolymerizability of the monomer that gives the structural unit (II-1), $E^1$ preferably represents —CO—O—.

Examples of the polar group in the acid-nonlabile group that includes a polar group, which is represented by $R^7$, include:

monovalent groups (a) such as a hydroxy group, a carboxy group, a cyano group, a sulfo group, a mercapto group and an amino group;

divalent groups (b) such as a carbonyl group, —O—, —S—, —NR'—, and a combination thereof; and the like, wherein R' represents a hydrogen atom or a monovalent hydrocarbon group having 1 to 20 carbon atoms.

The acid-nonlabile group that includes a polar group represented by $R^7$ is exemplified by: a group derived by substituting a part or all of hydrogen atoms included in a monovalent hydrocarbon group having 1 to 20 carbon atoms with the monovalent group (a); a group that includes the divalent group (b) between any or every two adjacent carbon atoms of a monovalent hydrocarbon group having 1 to 20 carbon atoms; a group that is derived by substituting a part or all of hydrogen atoms included in a monovalent hydrocarbon group having 1 to 20 carbon atoms with the monovalent group (a), and that includes the divalent group (b) between any or every adjacent carbon atoms thereof; and the like.

The monovalent hydrocarbon group having 1 to 20 carbon atoms is exemplified by a monovalent chain hydrocarbon group having 1 to 20 carbon atoms, a monovalent alicyclic hydrocarbon group having 3 to 20 carbon atoms, a monovalent aromatic hydrocarbon group having 6 to 20 carbon atoms, and the like.

Examples of the monovalent chain hydrocarbon group having 1 to 20 carbon atoms include groups similar to those exemplified in connection with $R^{e4}$, $R^{e5}$ and $R^{e6}$ in the above formula (Y-2), and the like.

Examples of the monovalent alicyclic hydrocarbon group having 3 to 20 carbon atoms include groups similar to those exemplified in connection with $R^{e1}$, $R^{e2}$ and $R^{e3}$ in the above formula (Y-1), and the like.

Examples of the monovalent aromatic hydrocarbon group having 6 to 20 carbon atoms include groups similar to those exemplified in connection with $R^{e1}$ in the above formula (Y-1), and the like.

$R^7$ is exemplified by a group that includes a lactone structure, a group that includes a cyclic carbonate structure, a group that includes a sultone structure, a group that includes a hydroxy group, and the like.

Examples of the group that includes a lactone structure include a butyrolactone-yl group, a norbornanelactone-yl group, a 5-oxo-4-oxatricyclo[4.3.1.1$^{3,8}$]undecane-yl group, and the like.

Examples of the group that includes a cyclic carbonate structure include an ethylene carbonate-ylmethyl group, and the like.

Examples of the group that includes a sultone structure include groups that include a sultone structure, such as a propane sulton-yl group and a norbornanesulton-yl group, and the like.

Examples of the group that includes a hydroxy group include a hydroxyadamantyl group, a dihydroxyadamantyl group, a trihydroxyadamantyl group, hydroxyethyl group, and the like.

In the structural unit (II-2), in light of the copolymerizability of a monomer that gives the structural unit (II-2)

$R^{6'}$ preferably represents a hydrogen atom.

The monovalent organic group which may be represented by $R^a$, $R^b$, $R^{7a}$ and $R^{7b}$ is exemplified by: a monovalent chain hydrocarbon group having 1 to 20 carbon atoms, a monovalent alicyclic hydrocarbon group having 3 to 20 carbon atoms, a monovalent aromatic hydrocarbon group having 6 to 20 carbon atoms, a group obtained from the monovalent chain hydrocarbon group, the monovalent alicyclic hydrocarbon group or the monovalent aromatic hydrocarbon group by substituting a part or all of hydrogen atoms included therein with a substituent; a group derived from the monovalent chain hydrocarbon group, the monovalent alicyclic hydrocarbon group or the monovalent aromatic hydrocarbon group by incorporating —CO—, —CS—, —O—, —S— or —NR"—, or a combination of two or more thereof between adjacent two carbons thereof; and the like, wherein R" represents a hydrogen atom or a monovalent hydrocarbon group.

Preferably, s is 1 or 2, and more preferably 1.

Examples of the structural unit (II) include:

structural units represented by the following formula (4-1-1) to (4-1-14) as the structural unit (II-1);

structural units represented by the following formulae (4-2-1) and (4-2-2) as the structural unit (II-2), and the like.

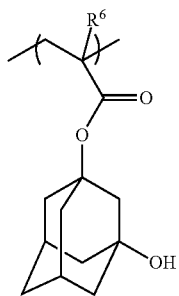
(4-1-1)
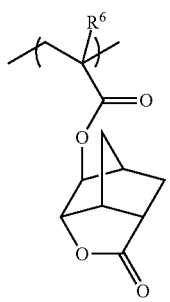
(4-1-2)
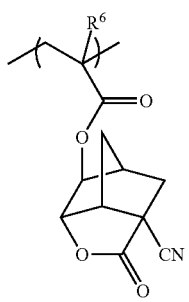
(4-1-3)
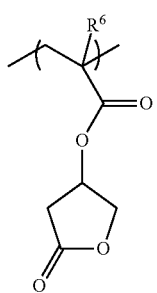
(4-1-4)
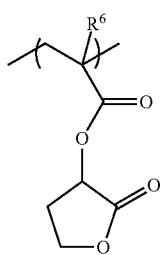
(4-1-5)
-continued
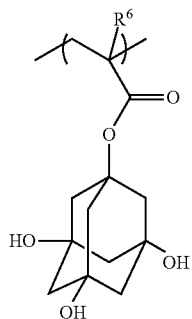
(4-1-6)
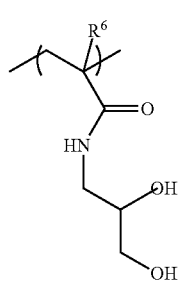
(4-1-7)
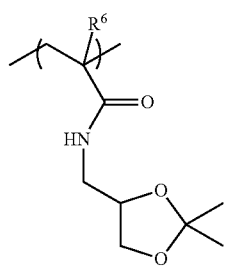
(4-1-8)
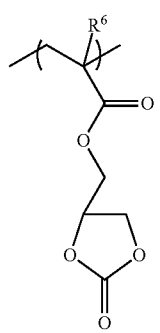
(4-1-9)
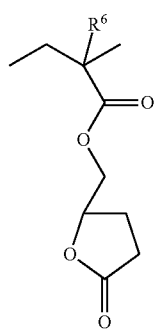
(4-1-10)

(4-1-11)
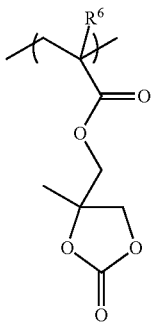

(4-1-12)
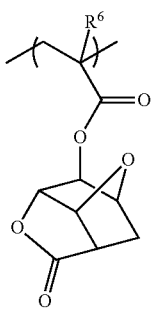

(4-1-13)
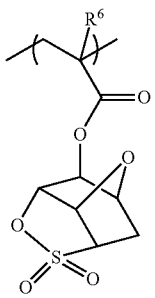

(4-1-14)
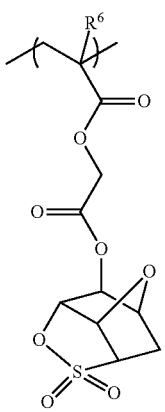

(4-2-1)
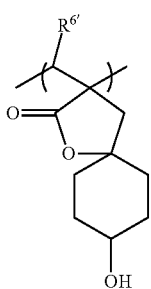

(4-2-2)
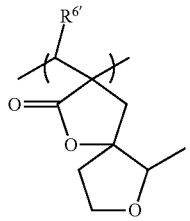

In the above formulae (4-1-1) to (4-1-14), $R^6$ is as defined in the above formula (4-1).

In the above formulae (4-2-1) and (4-2-2), $R^{6'}$ is as defined in the above formula (4-2).

Of these, the structural units represented by the above formulae (4-1-1), (4-1-3), (4-1-5) and (4-1-12) are preferred.

When the polymer (a) has the structural unit (II), the lower limit of the proportion of the structural unit (II) contained with respect to the total structural units constituting the polymer (a) is preferably 10 mol %, more preferably 20 mol %, and still more preferably 35 mol %. The upper limit of the proportion of the structural unit (II) contained is preferably 90 mol %, more preferably 80 mol %, and still more preferably 70 mol %. When the proportion of the structural unit (II) contained falls within the above range, the dispersibility of the acid generator (b) in the polymer (a) may be further improved, and as a result, the performances such as the LWR performance of the radiation-sensitive resin composition (I) can be further improved.

Other Structural Unit

The other structural unit is exemplified by a structural unit having a phenolic hydroxyl group, a structural unit that includes a nonlabile alicyclic hydrocarbon structure, and the like. The upper limit of the proportion of the other structural unit contained with respect to the total structural units constituting the polymer (a) is preferably 20 mol %, and more preferably 10 mol %.

Synthesis Method of Polymer (a)

The polymer (a) can be synthesized by a common method such as radical polymerization or the like. For example, the polymer (a) may be synthesized by: (1) a method including adding a solution containing a monomer and a radical initiator dropwise to a solution containing a reaction solvent or a monomer to permit a polymerization reaction; (2) a method including separately adding a solution containing a monomer and a solution containing a radical initiator dropwise to a solution containing a reaction solvent or a monomer to permit a polymerization reaction; (3) a method including separately adding a plurality of kinds of solutions containing each monomer, and a solution containing a radical initiator dropwise to a solution containing a reaction solvent or a monomer to permit a polymerization reaction; and (4) a method of permitting a polymerization reaction of a solution containing a monomer and a radical initiator in the absence of a solvent or in a reaction solvent; or the like.

It is to be noted that in a case where the reaction is permitted through adding a monomer solution to another monomer solution dropwise, the lower limit of the amount of the monomer in the monomer solution added dropwise is preferably 30 mol %, more preferably 50 mol %, and still more preferably 70 mol % with respect to the total amount of the monomer used in the polymerization.

The reaction temperature in these methods may be appropriately predetermined in accordance with the initiator species. The lower limit of the reaction temperature is preferably 30° C., more preferably 40° C., and still more preferably 50° C. The upper limit of the reaction temperature is preferably 150° C., more preferably 140° C., and still more preferably 130° C. The time period of the dropwise addition may vary depending on conditions such as the reaction temperature, the initiator type and the monomer to be reacted and the like, and the lower limit of the time period is preferably 30 min, more preferably 45 min, and still more preferably 1 hour. The upper limit of the time period of the dropwise addition is preferably 8 hrs, more preferably 6 hrs, and still more preferably 5 hrs. In addition, although the total reaction time period including the time period of the dropwise addition may also vary depending on conditions similarly to the time period of the dropwise addition, the lower limit of the total reaction time period is preferably 30 min, more preferably 45 min, and still more preferably 1 hour. The upper limit of the total reaction time period is preferably 12 hrs, more preferably 10 hrs, and still more preferably 8 hrs.

Examples of the radical initiator for use in the polymerization include: azo radical initiators such as azobisisobutyronitrile (AIBN), 2,2'-azobis(4-methoxy-2,4-dimethylvaleronitrile), 2,2'-azobis(2-cyclopropylpropionitrile), 2,2'-azobis(2,4-dimethylvaleronitrile), dimethyl 2,2'-azobis(2-methylpropionate) and dimethyl 2,2'-azobisisobutyrate; peroxide radical initiators such as benzoyl peroxide, t-butyl hydroperoxide and cumene hydroperoxide; and the like. Of these, AIBN and dimethyl 2,2'-azobis(2-methylpropionate) are preferred. It is to be noted that the radical initiator may be used either alone or in combination of two or more types thereof.

Any solvent may be used as the reaction solvent as long as the solvent is other than solvents that inhibit polymerization (nitrobenzene having a polymerization inhibitory effect, a mercapto compound having a chain transfer effect, etc.), and can dissolve the monomer. Examples of the reaction solvent include alcohols, ethers, ketones, amides, esters, lactones, nitriles, mixed solvents of these, and the like. These solvents may be used either alone or in combination of two or more types thereof.

The polymer obtained by the polymerization reaction is preferably recovered by a reprecipitation technique. More specifically, after the completion of the polymerization reaction, the intended polymer is recovered in the form of powder through charging the polymerization mixture into a reprecipitation solvent. Alcohols, alkanes and the like may be used as the reprecipitation solvent, either alone or in combination of two or more types thereof. Moreover, in addition to the reprecipitation technique, a liquid separating operation, a column operation, an ultrafiltration operation or the like enables the polymer to be recovered through eliminating low molecular weight components such as monomers and oligomers.

The lower limit of the polystyrene equivalent weight average molecular weight (Mw) of the polymer (a) as determined by GPC (Gel Permeation Chromatography) is preferably 1,000, more preferably 2,000, still more preferably 3,000, and particularly preferably 5,000. The upper limit of the Mw is preferably 50,000, more preferably 40,000, still more preferably 30,000, and particularly preferably 20,000. When the Mw of the polymer (a) is less than the lower limit described above, the heat resistance of the resist pattern formed from the radiation-sensitive resin composition (I) may be deteriorated. When the Mw of the polymer (a) is greater than the upper limit described above, the developability of the radiation-sensitive resin composition (I) may be deteriorated.

The lower limit of the ratio (Mw/Mn, or dispersity index) of the Mw to the polystyrene equivalent number average molecular weight (Mn), as determined by GPC, of the polymer (a) is typically 1. The upper limit of the ratio (Mw/Mn) is preferably 5, more preferably 3, and still more preferably 2.5.

The lower limit of the content of the polymer (a) with respect to the total solid content in the radiation-sensitive resin composition (I) is preferably 70% by mass, more preferably 80% by mass, and still more preferably 85% by mass.

(b) Acid Generator

The acid generator (b) is a substance that generates an acid upon an exposure. The acid generated allows the acid-labile group included in the structural unit (I) and structural unit (II) of the polymer (a) to be dissociated, thereby generating an oxoacid group and/or a phenolic hydroxyl group, etc. As a result, the solubility of these polymers in a developer solution is altered; therefore, the resist pattern can be formed from the radiation-sensitive resin composition (I). The acid generator (b) may be contained in the radiation-sensitive resin composition (I) either in the form of a low molecular weight compound described later (hereinafter, may be also referred to as "(b) acid generating agent" or "acid generating agent (b)", as appropriate), or in the form incorporated as a part of the polymer, or in both of these forms.

The acid generating agent (b) is exemplified by an onium salt compound, an N-sulfonyloxyimide compound, a halogen-containing compound, a diazo ketone compound, and the like.

The onium salt compound is exemplified by a sulfonium salt, a tetrahydrothiophenium salt, an iodonium salt, a phosphonium salt, a diazonium salt, a pyridinium salt, and the like.

Specific examples of the acid generating agent (b) include compounds disclosed in paragraphs [0080] to [0113] of Japanese Unexamined Patent Application, Publication No. 2009-134088, and the like.

When the radiation-sensitive resin composition (I) contains the acid generating agent (b) as the acid generator (b), the lower limit of the content of the acid generating agent (b) with respect to 100 parts by mass of the polymer (a) is, in light of securement of the sensitivity and developability of the radiation-sensitive resin composition (I), preferably 0.1 parts by mass, more preferably 0.5 parts by mass, still more preferably 1 part by mass, and particularly preferably 3 parts by mass. The upper limit of the content is preferably 40 parts by mass, more preferably 30 parts by mass, still more preferably 25 parts by mass. When the content of the acid generating agent (b) falls within the above range, the sensitivity and developability of the radiation-sensitive resin composition (I) can be improved, and as a result, LWR performance and the like can be further improved. One, or two or more kinds of the acid generator (b) may be used.

(c) Acid Diffusion Controller

The radiation-sensitive resin composition (I) may contain the acid diffusion controller (c) as needed. The acid diffusion controller (c) exerts the effect of controlling a diffusion phenomenon of the acid generated from the acid generator (b) upon an exposure in the resist film, and inhibiting unfavorable chemical reactions in an unexposed region. In addition, the storage stability of the resulting radiation-sensitive resin composition is further improved. Moreover, a resolution thereof for use as a resist is further improved, while variation of line width of the resist pattern caused by variation of post-exposure time delay from the exposure until a development treatment can be suppressed, which enables the radiation-sensitive resin composition with superior process stability to be obtained. The acid diffusion controller (c) may be contained in the radiation-sensitive resin composition (I) either in the form of a free compound (hereinafter, may be also referred to as "(c) acid diffusion control agent" or "acid diffusion control agent (c)", as appropriate) or in the form incorporated as a part of the polymer, or may be in both of these forms.

The acid diffusion control agent (c) is exemplified by a compound having one nitrogen atom in the same molecule (hereinafter, may be also referred to as "nitrogen-containing compound (I)"), a compound having two nitrogen atoms in the same molecule (hereinafter, may be also referred to as "nitrogen-containing compound (II)"), a compound having three nitrogen atoms (hereinafter, may be also referred to as "nitrogen-containing compound (III)"), an amide group-containing compound, a urea compound, a nitrogen-containing heterocyclic compound, and the like.

Examples of the nitrogen-containing compound (I) include: monoalkylamines such as n-hexylamine; dialkylamines such as di-n-butylamine; trialkylamines such as triethylamine and tri-n-pentylamine; aromatic amines such as aniline; and the like.

Examples of the nitrogen-containing compound (II) include ethylenediamine, N,N,N',N'-tetramethylethylenediamine, and the like.

Examples of the nitrogen-containing compound (III) include: polyamine compounds such as polyethylene imine and polyallylamine; polymers such as dimethylaminoethylacrylamide, and the like.

Examples of the amide group-containing compound include formamide, N-methylformamide, N,N-dimethylformamide, acetamide, N-methylacetamide, N,N-dimethylacetamide, propionamide, benzamide, pyrrolidone, N-methylpyrrolidone, and the like.

Examples of the urea compound include urea, methylurea, 1,1-dimethylurea, 1,3-dimethylurea, 1,1,3,3-tetramethylurea, 1,3-diphenylurea, tributylthiourea, and the like.

Examples of the nitrogen-containing heterocyclic compound include: pyridines such as pyridine and 2-methylpyridine; morpholines such as N-propylmorpholine and N-(undecan-1-ylcarbonyloxyethyl)morpholine; pyrazine; pyrazole; and the like.

Also, as the nitrogen-containing organic compound, a compound having an acid-labile group may be used. Examples of such a nitrogen-containing organic compound having an acid-labile group include N-t-butoxycarbonylpiperidine, N-t-butoxycarbonylimidazole, N-t-butoxycarbonylbenzimidazole, N-t-butoxycarbonyl-2-phenylbenzimidazole, N-(t-butoxycarbonyl) di-n-octylamine, N-(t-butoxycarbonyl)diethanolamine, N-(t-butoxycarbonyl)dicyclohexylamine, N-(t-butoxycarbonyl)diphenylamine, N-t-butoxycarbonyl-4-hydroxypiperidine, N-t-amyloxycarbonyl-4-hydroxypiperidine, and the like.

In addition, a photodegradable base which is sensitized upon an exposure to generate a weak acid can be used as the acid diffusion control agent (c). The photodegradable base is exemplified by an onium salt compound and the like that loses acid diffusion controllability through degradation upon an exposure. Alternatively, the photodegradable base is exemplified by a compound that includes a monovalent radiation-sensitive onium cation and a weak acid anion, and the like.

The photodegradable base is preferably a sulfonium salt, more preferably a triarylsulfonium salt, and still more preferably triphenylsulfonium salicylate and triphenylsulfonium 10-camphorsulfonate.

When the radiation-sensitive resin composition (I) contains the acid diffusion control agent (c) as the acid diffusion controller (c), the lower limit of the content of the acid diffusion control agent (c) with respect to 100 parts by mass of the polymer (a) is preferably 0.1 parts by mass, more preferably 0.5 parts by mass, still more preferably 1 part by mass, and particularly preferably 2 parts by mass. The upper limit of the content of the acid diffusion control agent (c) is preferably 20 parts by mass, more preferably 15 parts by mass, still more preferably 10 parts by mass, and particularly preferably 7 parts by mass. When the content of the acid diffusion control agent (c) falls within the above range, the resolution, storage stability and the like of the radiation-sensitive resin composition (I) can be improved. When the content of the acid diffusion control agent (c) is greater than the upper limit described above, the sensitivity of the radiation-sensitive resin composition (I) may be deteriorated.

(d) Solvent

The radiation-sensitive resin composition (I) typically contains the solvent (d). The solvent (d) is not particularly limited as long as it can dissolve or disperse therein at least the polymer (a), the acid generator (b) as well as the acid diffusion controller (c) which may be contained if desired, and the like.

The solvent (d) is exemplified by an alcohol solvent, an ether solvent, a ketone solvent, an amide solvent, an ester solvent, a hydrocarbon solvent, and the like.

Examples of the alcohol solvent include:

monohydric alcohol solvents such as methanol, ethanol, n-propanol, iso-propanol, n-butanol, iso-butanol, sec-butanol, tert-butanol, n-pentanol, iso-pentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol and diacetone alcohol;

polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol and tripropylene glycol;

polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether and dipropylene glycol monopropyl ether; and the like.

Examples of the ether solvent include:

dialkyl ether solvents such as diethyl ether, dipropyl ether and dibutyl ether;

cyclic ether solvents such as tetrahydrofuran and tetrahydropyran;

aromatic ring-containing ether solvents such as diphenyl ether and anisole (methyl phenyl ether), and the like.

Examples of the ketone solvent include:

chain ketone solvents such as acetone, methyl ethyl ketone, methyl n-propyl ketone, methyl n-butyl ketone, diethyl ketone, methyl iso-butyl ketone, 2-heptanone (methyl-n-pentyl ketone), ethyl n-butyl ketone, methyl n-hexyl ketone, di-iso-butyl ketone and trimethylnonanone;

cyclic ketone solvents such as cyclopentanone, cyclohexanone, cycloheptanone, cyclooctanone and methylcyclohexanone;

2,4-pentanedione, acetonylacetone and acetophenone; and the like.

Examples of the amide solvent include:

cyclic amide solvents such as N,N'-dimethyl imidazolidinone and N-methylpyrrolidone;

chain amide solvents such as N-methylformamide, N,N-dimethylformamide, N,N-diethylformamide, acetamide, N-methylacetamide, N,N-dimethylacetamide and N-methylpropionamide, and the like.

Examples of the ester solvent include:

acetic acid ester solvents such as methyl acetate, ethyl acetate, n-propyl acetate, iso-propyl acetate, n-butyl acetate, iso-butyl acetate, sec-butyl acetate, n-pentyl acetate, i-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate and n-nonyl acetate;

polyhydric alcohol partial ether acetate solvents such as ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate and dipropylene glycol monoethyl ether acetate;

glycol diacetate, methoxytriglycol acetate, ethyl propionate, n-butyl propionate, iso-amyl propionate, diethyl oxalate, di-n-butyl oxalate, methyl acetoacetate, ethyl acetoacetate, methyl lactate, ethyl lactate, n-butyl lactate, n-amyl lactate, diethyl malonate, dimethyl phthalate, diethyl phthalate; and the like.

Examples of the hydrocarbon solvent include:

aliphatic hydrocarbon solvents such as n-pentane, iso-pentane, n-hexane, iso-hexane, n-heptane, iso-heptane, 2,2,4-trimethylpentane, n-octane, iso-octane, cyclohexane and methylcyclohexane;

aromatic hydrocarbon solvents such as benzene, toluene, xylene, mesitylene, ethylbenzene, trimethylbenzene, methylethylbenzene, n-propylbenzene, iso-propylbenzene, diethylbenzene, iso-butylbenzene, triethylbenzene, di-iso-propylbenzene and n-amylnaphthalene; and the like.

Of these, ester solvents and ketone solvents are preferred, polyhydric alcohol partial ether acetate solvents and cyclic ketone solvents are more preferred, and propylene glycol monomethyl ether acetate, cyclohexanone and γ-butyrolactone are still more preferred. The radiation-sensitive resin composition (I) may contain one, or two or more types of the solvent (d).

Other Components

The radiation-sensitive resin composition (I) may contain as other components except for the components (a) to (d) described above, for example, a fluorine atom-containing polymer (except for those corresponding to the polymer (a)), a surfactant, an alicyclic skeleton-containing compound, a sensitizing agent, and/or the like. The radiation-sensitive resin composition (I) may contain each one, or two or more types of the other component.

Preparation Method of Radiation-Sensitive Resin Composition

The radiation-sensitive resin composition (I) may be prepared by, for example, mixing the polymer (a), the acid generator (b), etc., with the solvent (d) in a certain ratio. After the mixing, it is preferred that the resulting mixture is filtered through a filter having a pore size of about 0.2 μm, for example. The lower limit of the solid content concentration of the radiation-sensitive resin composition (I) is preferably 0.1% by mass, more preferably 0.5% by mass, and still more preferably 1% by mass. The upper limit of the solid content concentration is preferably 50% by mass, more preferably 30% by mass, and still more preferably 20% by mass.

EXAMPLES

Hereinafter, modes for carrying out the present invention will be more specifically described by way of Examples. However, the present invention is not in any way limited to these Examples. Measuring methods for various physical property values are demonstrated below.

Mw and Mn

The Mw and the Mn of the polymer were determined with gel permeation chromatography using GPC columns (Tosoh Corporation, "G2000HXL"×2, "G3000HXL"×1, and "G4000HXL"×1) under the following conditions:

column temperature: 40° C.;

elution solvent: tetrahydrofuran (Wako Pure Chemical Industries, Ltd.);

flow rate: 1.0 mL/min;

sample concentration: 1.0% by mass;

amount of injected sample: 100 μL;

detector: differential refractometer; and standard substance: mono-dispersed polystyrene.

$^{13}$C-NMR Analysis

A nuclear magnetic resonance apparatus (JEOL, Ltd., "JNM-EX270") was used for the measurement on the $^{13}$C-NMR analysis of each polymer.

Preparation of Radiation-Sensitive Resin Composition

Synthesis of Polymers (a)

Monomers (compounds (M-1) to (M-8)) used in the synthesis of the polymers (a) are as shown below.

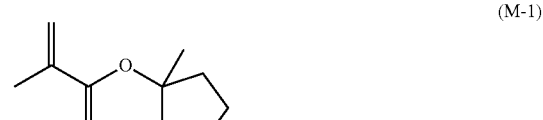

(M-1)

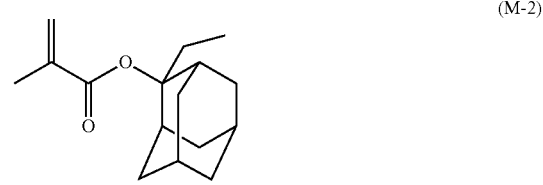

(M-2)

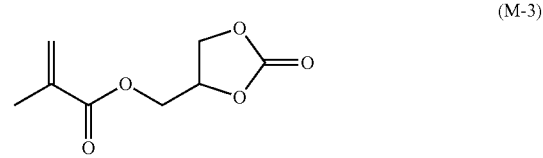

(M-3)

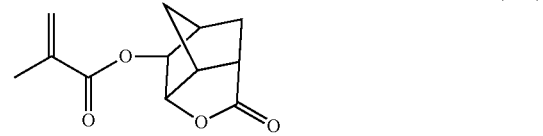

(M-4)

-continued

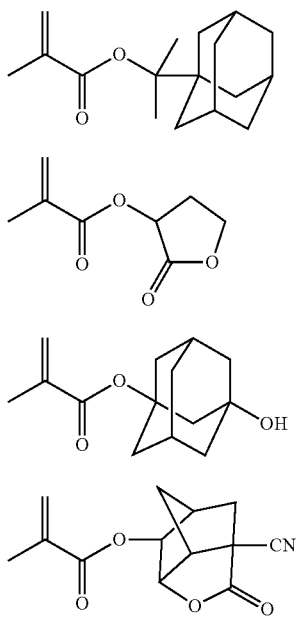

(M-5)

(M-6)

(M-7)

(M-8)

The compounds (M-1), (M-2), and (M-5) each give the structural unit (I), whereas the compounds (M-3), (M-4), (M-6), (M-7) and (M-8) each give the structural unit (II).

Synthesis Example 1

A monomer solution was prepared by dissolving 35 mol % of the compound (M-1), 25 mol % of the compound (M-2), 10 mol % of the compound (M-3) and 30 mol % of the compound (M-4) as the monomers, and 2,2'-azobisisobutyronitrile (AIBN) as the radical polymerization initiator, in 30 g of methyl ethyl ketone. The total amount of the monomers when charged was adjusted to 30 g. It is to be noted that the amount of each monomer used is indicated by mol % basis with respect to the total amount of the monomers, whereas the amount of the radical polymerization initiator used was 5 mol % with respect to the total amount of the monomers and the radical polymerization initiator.

Next, 30 g of ethyl methyl ketone was charged into a 500 mL three-neck flask equipped with a thermometer and a dropping funnel, and purging with nitrogen was executed for 30 min. Thereafter, the content in the flask was heated so as to reach 80° C. with stirring by means of a magnetic stirrer.

Next, the monomer solution was added dropwise into the flask over 3 hrs using the dropping funnel. Following the dropwise addition, aging was allowed for 3 hrs, and thereafter the mixture was cooled to 30° C. or below to obtain a polymer solution. This polymerization reaction solution was poured into 600 g of methanol, and a precipitated white powder was filtered off. The collected white powder was washed twice with 120 g of methanol in a slurry, filtered off, and then dried at 50° C. for 17 hrs, whereby a polymer (a-1) was obtained as a white powder (product amount: 23.3 g; yield: 78%). The result of the $^{13}$C-NMR analysis indicated that each proportion of the structural units derived from the compounds (M-1) to (M-4) in the polymer (a-1) was 36.7:22.3:9.8:31.2 (mol %). In addition, the polymer (a-1) had an Mw of 6,500 and an Mw/Mn of 1.4.

Synthesis Examples 2 and 3

Polymers (a-2) and (a-3) were synthesized in a similar manner to Synthesis Example 1 except that the type and the amount of each monomer used were as specified in Table 1 below. The yield, the Mw and the Mw/Mn of the polymer (a), and the proportion of each structural unit contained in the polymer (a) are shown together in Table 1 below.

TABLE 1

| | (a) Polymer | type | Monomer that gives structural unit (I) amount (mol %) | proportion of the structural unit contained (mol %) | type | Monomer that gives structural unit (II) amount (mol %) | proportion of the structural unit contained (mol %) | Yield (%) | Mw | Mw/ Mn |
|---|---|---|---|---|---|---|---|---|---|---|
| Synthesis Example 1 | a-1 | M-1 M-2 | 35 25 | 36.7 22.3 | M-3 M-4 | 10 30 | 9.8 31.2 | 78 | 6,500 | 1.4 |
| Synthesis Example 2 | a-2 | M-1 M-5 | 20 20 | 20.6 18.9 | M-6 | 60 | 60.5 | 79 | 8,100 | 1.5 |
| Synthesis Example 3 | a-3 | M-1 M-2 | 35 25 | 36.5 23.1 | M-7 M-8 | 10 30 | 9.4 31.0 | 74 | 6,900 | 1.4 |

Preparation of Radiation-Sensitive Resin Composition

Components constituting the radiation-sensitive resin composition are as in the following.

(b) Acid Generating Agent

Structure formulae are shown below.

b-1: triphenylsulfonium 2-(adamantan-1-yl)-1,1-difluoroethane-1-sulfonate b-2: triphenylsulfonium 6-(adamantan-1-ylcarbonyloxy)-1,1,2,2-tetrafluorohexane-1-sulfonate

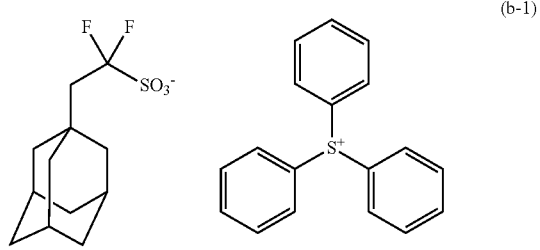

(b-1)

-continued (b-2)
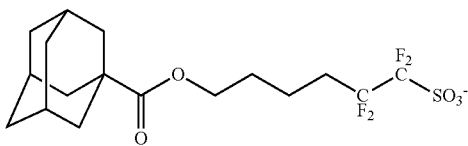

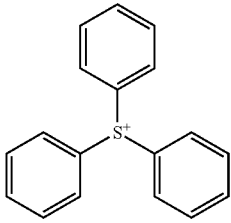

(c) Acid Diffusion Control Agent

Structure formulae are shown below.

c-1: 2-phenylbenzimidazole c-2: triphenylsulfonium 7,7-dimethyl-2-oxo-bicyclo[2.2.1]hept-1-ylmethanesulfonate (d) Solvent d-1: propylene glycol monomethyl ether acetate d-2: cyclohexanone d-3: γ-butyrolactone Synthesis Example 4

A radiation-sensitive resin composition (J-1) was prepared by mixing 100 parts by mass of (a-1) as the polymer (a), 12 parts by mass of (b-1) as the acid generating agent (b), 0.64 parts by mass of (c-1) as the acid diffusion control agent (c), and 1,897 parts by mass of (d-1), 813 parts by mass of (d-2) and 30 parts by mass of (d-3) as the solvent (d), and filtering the resulting mixture through a membrane filter having a pore size of 0.2 p.m.

Synthesis Examples 5 and 6

Radiation-sensitive resin compositions (J-2) and (J-3) were prepared in a similar manner to Synthesis Example 4 except that the type and the content of each component were as specified in Table 2 below.

TABLE 2

| | | (a) Polymer | | (b) Acid generating agent | | (c) Acid diffusion control agent | | (d) Solvent | |
|---|---|---|---|---|---|---|---|---|---|
| | Radiation-sensitive resin composition | type | content (parts by mass) | type | content (parts by mass) | type | content (parts by mass) | type | content (parts by mass) |
| Synthesis Example 4 | J-1 | a-1 | 100 | b-1 | 12 | c-1 | 0.64 | d-1 d-2 d-3 | 1,897 813 30 |
| Synthesis Example 5 | J-2 | a-2 | 100 | b-1 b-2 | 5 7 | c-2 | 4.83 | d-1 d-2 d-3 | 1,953 837 30 |
| Synthesis Example 6 | J-3 | a-3 | 100 | b-1 | 12 | c-1 | 0.64 | d-1 d-2 d-3 | 1,980 849 30 |

Preparation of Composition for Resist Pattern-Refinement

Components constituting the composition for resist pattern-refinement are as in the following.

(A) Sulfonic Acid

Structural formulae of (A–1) and (A-2) are shown below. In addition, the pKa values of the sulfonic acids (A) are as in the following.

A-1: vinylsulfonic acid (pKa=−1.33)

A-2: p-toluenesulfonic acid monohydrate (pKa=−2.14)

CA-1: polyacrylic acid (pKa=4.72)

(c-1)
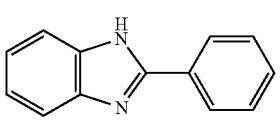

(c-2)
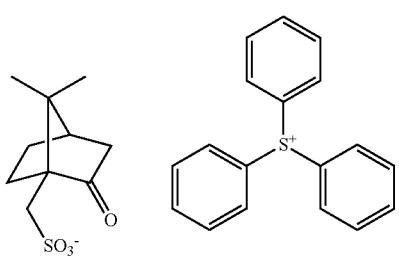

(A-1)
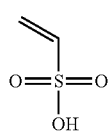

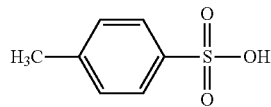
(A-2)

(B) Salt

Each structure formula is shown below.

In addition, the pKa of a conjugate acid of a base that includes the anion of each salt (B) is as in the following.

B-1: triphenylsulfonium 2-(adamantan-1-yl)-1,1-difluoroethane-1-sulfonate (pKa=−1.49)
B-2: triphenylsulfonium 6-(adamantan-1-ylcarbonyloxy)-1,1,2,2-tetrafluorohexane-1-sulfonate (pKa=−2.32)
B-3: triphenylsulfonium 2-(adamantan-1-yloxycarbonyl)-3,3,3-trifluoropropane-1-sulfonate (pKa=−1.38)
B-4: triphenylsulfonium 3-(adamantan-1-yloxycarbonyl)-1,1,1-trifluoropropane-2-sulfonate (pKa=−1.43)
B-5: triphenylsulfonium 2-(adamantan-1-ylcarbonyloxy)-3,3,3-trifluoropropane-1-sulfonate (pKa=−1.39)
B-6: 4-cyclohexylsulfonylphenyldiphenylsulfonium 5,6-di(cyclohexyloxycarbonyl)norbornane-2-sulfonate (pKa=−0.7)
B-7: triphenylsulfonium nonafluoro-n-butane-1-sulfonate (pKa=−3.31)
B-8: triphenylsulfonium adamantan-1-ylmethoxycarbonyldifluoromethanesulfonate (pKa=−1.66)
B-9: 4-t-butylphenyldiphenylsulfonium nonafluoro-n-butane-1-sulfonate (pKa=−3.31)
B-10: 4-t-butylphenyldinaphthylsulfonium nonafluoro-n-butane-1-sulfonate (pKa=−3.31)
B-11: 4-t-butylphenylnaphthylbiphenylsulfonium nonafluoro-n butane-1-sulfonate (pKa=−3.31)
B-12: tri(4-methoxyethoxyethylphenyl)sulfonium nonafluoro-n-butane-1-sulfonate (pKa=−3.31)

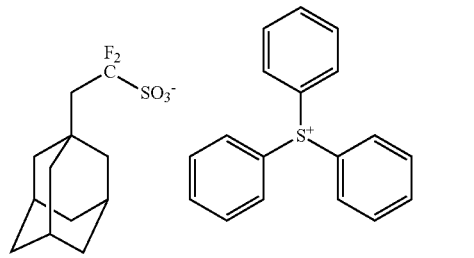
(B-1)

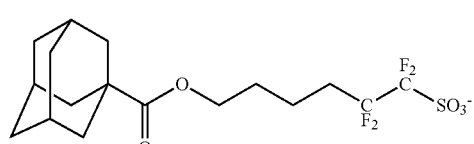
(B-2)

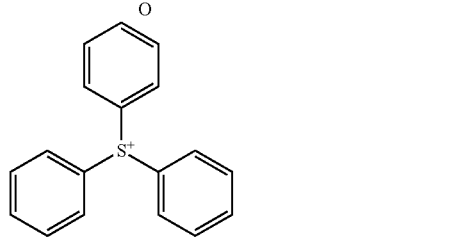

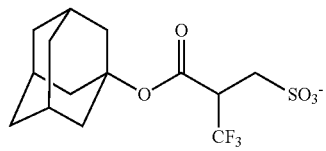
(B-3)

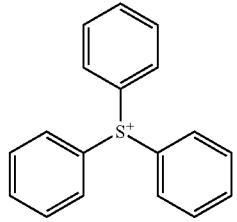
(B-4)

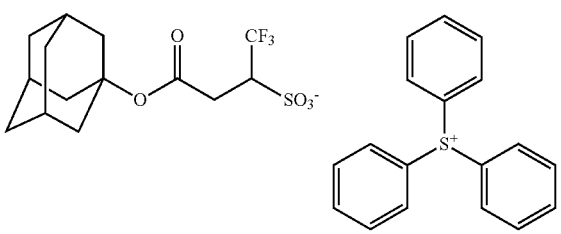
(B-5)

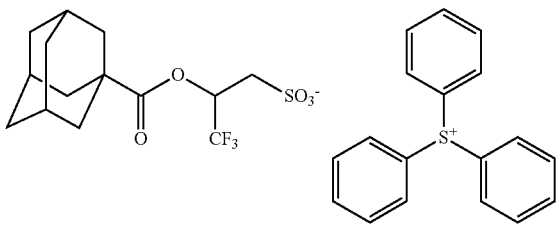
(B-6)

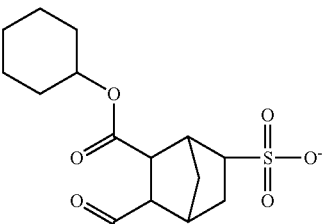

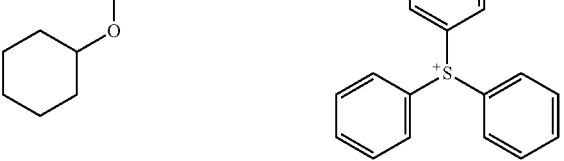

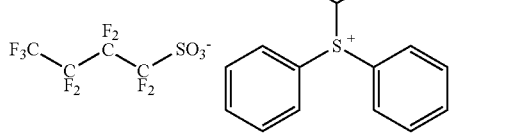
(B-7)

-continued

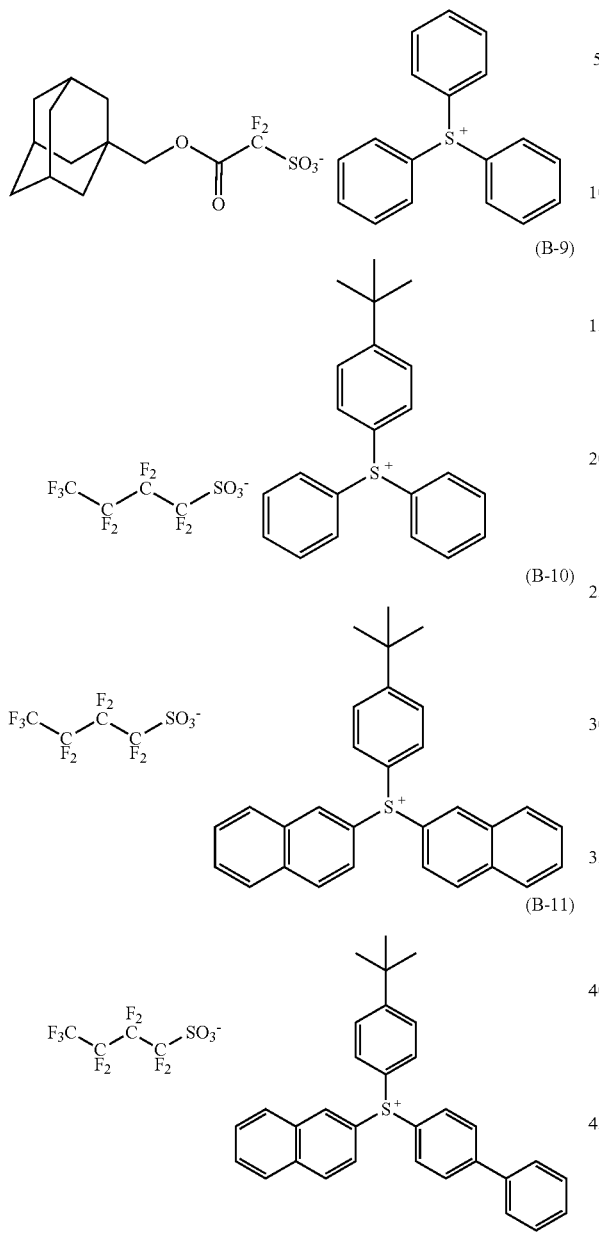

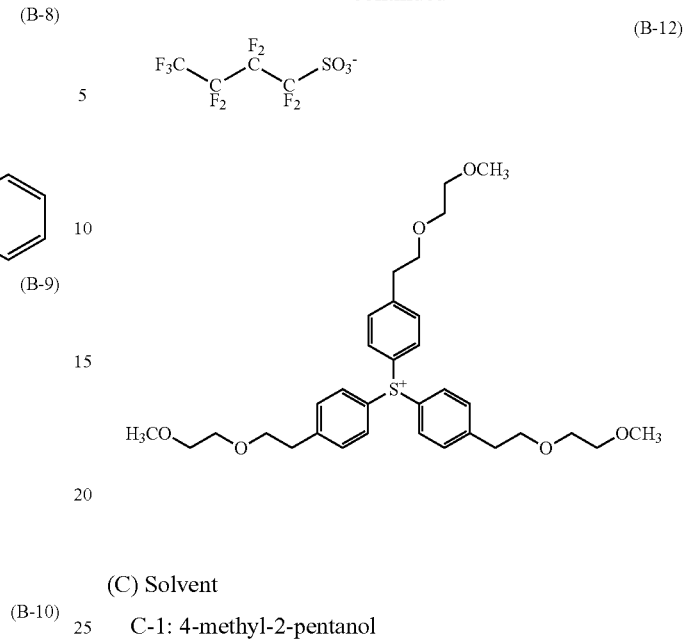

(C) Solvent

C-1: 4-methyl-2-pentanol

Example 1

A composition for resist pattern-refinement (S–1) was prepared by mixing 0.05 parts by mass of (A–1) as the sulfonic acid (A), 0.28 parts by mass of (B–1) as the salt (B) and 99.67 parts by mass of (C–1) as the solvent (C), and and filtering the resulting mixture through a membrane filter having a pore size of 0.2 μm.

Examples 2 to 15, and Comparative Examples 1 and 2

Compositions for resist pattern-refinement (S-2) to (S-15), and (CS-1) and (CS-2) were prepared in a similar manner to Example 1 except that the type and the amount of each component blended were as specified in Table 3 below. In Table 3, it is to be noted that "-" indicates that the corresponding component was not used.

TABLE 3

| | Composition for resist pattern-refinement | (A) Sulfonic acid | | (B) Salt | | (C) Solvent | |
|---|---|---|---|---|---|---|---|
| | | type | amount blended (parts by mass) | type | amount blended (parts by mass) | type | amount blended (parts by mass) |
| Example 1 | S-1 | A-1 | 0.05 | B-1 | 0.28 | C-1 | 99.67 |
| Example 2 | S-2 | A-1 | 0.05 | B-2 | 0.35 | C-1 | 99.60 |
| Example 3 | S-3 | A-1 | 0.05 | B-3 | 0.31 | C-1 | 99.64 |
| Example 4 | S-4 | A-1 | 0.05 | B-4 | 0.31 | C-1 | 99.64 |
| Example 5 | S-5 | A-1 | 0.05 | B-5 | 0.31 | C-1 | 99.64 |
| Example 6 | S-6 | A-1 | 0.05 | B-6 | 0.43 | C-1 | 99.52 |
| Example 7 | S-7 | A-2 | 0.10 | B-1 | 0.35 | C-1 | 99.55 |
| Example 8 | S-8 | A-2 | 0.15 | B-3 | 0.59 | C-1 | 99.26 |
| Example 9 | S-9 | A-2 | 0.15 | B-4 | 0.59 | C-1 | 99.26 |

TABLE 3-continued

|  | Composition for resist pattern-refinement | (A) Sulfonic acid | | (B) Salt | | (C) Solvent | |
| --- | --- | --- | --- | --- | --- | --- | --- |
|  |  | type | amount blended (parts by mass) | type | amount blended (parts by mass) | type | amount blended (parts by mass) |
| Example 10 | S-10 | A-1 | 0.05 | B-7 | 0.29 | C-1 | 99.66 |
| Example 11 | S-11 | A-1 | 0.05 | B-8 | 0.30 | C-1 | 99.65 |
| Example 12 | S-12 | A-1 | 0.05 | B-9 | 0.32 | C-1 | 99.63 |
| Example 13 | S-13 | A-1 | 0.05 | B-10 | 0.37 | C-1 | 99.58 |
| Example 14 | S-14 | A-1 | 0.05 | B-11 | 0.38 | C-1 | 99.57 |
| Example 15 | S-15 | A-1 | 0.05 | B-12 | 0.45 | C-1 | 99.50 |
| Comparative Example 1 | CS-1 | CA-1 | 3 | B-1 | 0.28 | C-1 | 96.72 |
| Comparative Example 2 | CS-2 | A-1 | 0.015 | — | — | C-1 | 99.985 |

Formation of Resist Pattern (1)

By using each radiation-sensitive resin composition prepared as described above, a silicon wafer patterned to have 90 nm line-and-space was produced as in the following.

An underlayer antireflective film having a thickness of 77 nm was provided on an 8-inch silicon wafer by spin-coating an underlayer antireflective film-forming composition (Brewer Science, Inc., "ARC29A") with a spin coater (Tokyo Electron Limited, "CLEAN TRACK ACTS"), followed by PB at 205° C. for 60 sec. On the underlayer antireflective film provided, the radiation-sensitive resin composition was spin-coated using the aforementioned spin coater, followed by PB at 100° C. for 60 sec to form a resist film having a thickness of 100 nm. The resist film thus formed was exposed through a mask pattern of 90 nm-Line and 180 nm-Pitch by using an ArF excimer laser scanner (NIKON Corporation, "NSR S306C", irradiation conditions: NA=0.78; σ0/σ1=0.93/0.62; Dipole), followed by PEB at 100° C. for 60 sec. Then, the resist film exposed was developed with a 2.38% by mass aqueous tetramethylammonium hydroxide solution, under a condition at 23° C. for 30 sec. After washing with water and drying, a positive type resist pattern was formed. A resist pattern formed from the radiation-sensitive resin composition (J-n) according to the aforementioned procedure is designated as "R-n-1".

It is to be noted that in the aforementioned procedure, an exposure dose at which the area exposed through the mask pattern of 90 nm-Line and 180 nm-Pitch exhibited formation of lines with the line width of 90 nm was defined as an optimum exposure dose (Eop). Note that a scanning electron microscope (Hitachi High-Technologies Corporation, "S-9380") was used for a line-width measurement of the resist pattern.

Refining of Resist Pattern (1)

Example 16

On the 8-inch wafer having the resulting resist pattern (R-1-1) formed thereon, the composition for resist pattern-refinement (S-1) was spin-coated by using the aforementioned spin coater, and baked at 80° C. for 60 sec, followed by cooling at 23° C. for 30 sec with a cooling plate. Subsequently, a development with a 2.38% by mass aqueous tetramethylammonium hydroxide solution was carried out under a condition at 23° C. for 20 sec, followed by rinsing with ultra pure water, and drying to produce a substrate for evaluations.

Examples 17 to 33 and Comparative Example 3

The refining treatment was carried out in a similar manner to Example 16 except that the types of the composition for resist pattern-refinement and the resist pattern employed were as shown in Table 4 below, and that the baking temperature was as shown in Table 4 below.

Comparative Example 4

The baking and development treatments were carried out without subjecting to the refining treatment with the composition for resist pattern-refinement.

Evaluations

The substrates for evaluation obtained as described above were evaluated through the measurements on the following items. The results of the evaluations are shown in Table 4 below.

Degree of Line Width Refinement

The dimension of the resist pattern which had the line width of 90 nm before coating the composition for resist pattern-refinement was measured with the aforementioned scanning electron microscope after subjecting to the refining treatment. The degree of line width refinement was calculated according to the following formula (X).

Degree of line width refinement (%)={(line width (nm) before the treatment)−(line width (nm) after the treatment)}/{(line width (nm) before the treatment)}×100    (X)

LWR (Line Width Roughness)

The dimension of the resist pattern which had the line width of 90 nm before coating the composition for resist pattern-refinement was measured with the aforementioned scanning electron microscope on an LWR measurement mode, after subjecting to the refining treatment. Along the ordinate of a patterned line, the line width was measured at equally-spaced 32 points (measurement range: 1,000 nm), and a 3σ value was determined from the line widths at the 32 points. This procedure was repeated on different ten patterned lines, and with respect to ten 3σ values, an average derived according to the following formula (Y) was defined as LWR (nm).

LWR=(sum of 3σ values of the first to tenth patterned lines)/10    (Y)

TABLE 4

| | Composition for resist pattern-refinement | Resist pattern | Baking temperature (° C.) | Degree of line width refinement (%) | LWR (nm) |
|---|---|---|---|---|---|
| Example 16 | S-1 | R-1-1 | 80 | 18.3 | 4.8 |
| Example 17 | S-2 | R-1-1 | 80 | 29.2 | 4.7 |
| Example 18 | S-3 | R-1-1 | 80 | 11.4 | 5.2 |
| Example 19 | S-3 | R-1-1 | 100 | 24.1 | 5.1 |
| Example 20 | S-4 | R-1-1 | 80 | 17.4 | 4.9 |
| Example 21 | S-5 | R-1-1 | 80 | 12.9 | 4.4 |
| Example 22 | S-6 | R-1-1 | 80 | 7.1 | 4.5 |
| Example 23 | S-7 | R-1-1 | 80 | 20.0 | 4.4 |
| Example 24 | S-8 | R-1-1 | 80 | 15.4 | 5.0 |
| Example 25 | S-9 | R-1-1 | 80 | 21.0 | 4.7 |
| Example 26 | S-1 | R-2-1 | 80 | 19.0 | 4.2 |
| Example 27 | S-1 | R-3-1 | 80 | 19.2 | 4.9 |
| Example 28 | S-10 | R-1-1 | 80 | 30.1 | 5.3 |
| Example 29 | S-11 | R-1-1 | 80 | 25.2 | 4.9 |
| Example 30 | S-12 | R-1-1 | 80 | 26.4 | 5.1 |
| Example 31 | S-13 | R-1-1 | 80 | 23.1 | 5.1 |
| Example 32 | S-14 | R-1-1 | 80 | 22.9 | 5.2 |
| Example 33 | S-15 | R-1-1 | 80 | 24.8 | 4.9 |
| Comparative Example 3 | CS-1 | R-1-1 | 80 | 3.9 | 5.7 |
| Comparative Example 4 | — | R-1-1 | 80 | 1.1 | 6.5 |

As is seen from the results shown in Table 4, according to the compositions for resist pattern-refinement of Examples, it was possible to obtain microfabricated patterns with smaller LWR and high accuracy.

Formation of Resist Pattern (2)

By using the radiation-sensitive resin composition prepared as described above, a circular cylindrical dot pattern of 45 nm-Dot and 150 nm-Pitch was formed as in the following.

An underlayer antireflective film having a thickness of 105 nm was provided on a 12-inch silicon wafer by spin-coating an underlayer antireflective film (Brewer Science, Inc., "ARC66") with a spin coater (Tokyo Electron Limited, "CLEAN TRACK ACT12"), followed by PB at 205° C. for 60 sec. On the underlayer antireflective film provided, the radiation-sensitive resin composition was spin-coated using the aforementioned spin coater, followed by PB at 100° C. for 60 sec to form a resist film having a thickness of 80 nm. On the resist film thus formed, an upper layer film-forming composition disclosed in Example 1 of WO 2008/047678 was spin-coated, followed by PB at 90° C. for 60 sec to form an upper layer film having a thickness of 30 nm. Next, the resist film provided with the upper layer film thereon was exposed through a mask pattern of 55 nm-Dot and 150 nm-Pitch by using an ArF excimer laser immersion scanner (NIKON Corporation, "NSR S610C") under conditions involving NA=1.3, ratio=0.75 and Annular. Subsequent to the exposure, PEB was carried out at 100° C. for 60 sec, and then the resist film exposed was developed with a 2.38% by mass aqueous tetramethylammonium hydroxide solution, under a condition at 23° C. for 30 sec. After washing with water and drying, a positive type resist pattern was formed. A resist pattern formed from the radiation-sensitive resin composition (J-n) according to the aforementioned procedure is designated as "R-n-2".

In this procedure, an exposure dose at which the area exposed through the mask pattern of 55 nm-Dot and 150 nm-Pitch exhibited a formation of circular cylindrical dot pattern with a width of 45 nm was defined as an optimum exposure dose (Eop). Note that a scanning electron microscope (Hitachi High-Technologies Corporation, "CG-4000") was used for a width measurement of the resist pattern.

Refinement of Resist Pattern (2)

Example 34

On the 8-inch wafer having the circular cylindrical dot pattern of 45 nm-Dot and 150 nm-Pitch formed thereon, the composition for resist pattern-refinement was spin-coated by using a spin coater (Tokyo Electron Limited, "CLEAN TRACK ACTS"), and baked at 80° C. for 60 sec, followed by cooling at 23° C. for 30 sec with a cooling plate. Subsequently, a development with a 2.38% by mass aqueous tetramethylammonium hydroxide solution was carried out under a condition at 23° C. for 20 sec, followed by rinsing with ultra pure water, and drying to produce a substrate for evaluations.

Example 35 and Comparative Example 5

The refining treatment was carried out in a similar manner to Example 34 except that the composition for resist pattern-refinement and the resist pattern employed were as shown in Table 5 below, and that the baking temperature was as shown in Table 5 below.

Evaluations

The substrates for evaluation obtained as described above were evaluated through the measurements on the following items. The results of the evaluations are shown in Table 5 below.

Degree of Width Refinement

The dimension of the resist pattern which had the width of 45 nm before coating the composition for resist pattern-refinement was measured with a scanning electron microscope (Hitachi High-Technologies Corporation, "CG-4000") after subjecting to the refining treatment. The degree of width refinement was calculated according to the following formula (X).

Degree of width refinement (%)={(width (nm) before the treatment)−( width (nm) after the treatment)}/{(width (nm) before the treatment)}×100     (X)

Occurrence of Pattern Collapse

After the resist pattern having a width of 45 nm before coating the composition for resist pattern-refinement was subjected to the refining treatment, an inspection with a scanning electron microscope (Hitachi High-Technologies Corporation, "CG-4100") was performed to evaluate as to whether or not any dot pattern collapse occurred in an area of 10 μm×20 μm. When a pattern collapse occurred the evaluation was made by referring to "found", whereas when any pattern collapse did not occur the evaluation was made by referring to "not found".

TABLE 5

| | Composition for resist pattern-refinement | Resist pattern | Baking temperature (° C.) | Degree of width refinement (%) | Occurrence of pattern collapse |
|---|---|---|---|---|---|
| Example 34 | S-1 | R-1-2 | 80 | 24.9 | not found |
| Example 35 | S-4 | R-1-2 | 80 | 28.7 | not found |
| Comparative Example 5 | CS-2 | R-1-2 | 80 | 29.1 | found |

As is seen from the results shown in Table 5, according to the compositions for resist pattern-refinement of Examples, favorable microfabrication of the resist pattern is enabled, while the pattern collapse is inhibited.

INDUSTRIAL APPLICABILITY

The composition for resist pattern-refinement of the embodiment of the present invention enables effective and accurate microfabrication of a resist pattern, and a pattern out of the limitation of the wavelength can be favorably and economically formed; therefore, the composition can be extremely suitably used in the field of microfabrication typified by manufacture of integrated circuit elements for which further progress of miniaturization from now on is envisaged.

EXPLANATION OF THE REFERENCE SYMBOLS 1, 11: resist pattern
2: composition for resist pattern-refinement
3: alkali-solubilizable layer
10: substrate
W1, W2: line width

What is claimed is:

1. A composition for resist pattern-refinement comprising an ion represented by formula (1-1), an ion represented by formula (1-2), an ion represented by formula (2-1), an ion represented by formula (2-2) and a solvent,
   a total amount of the ions blended being no less than 50% by mass with respect to a sum of components other than the solvent, $$R^1-Z-R^2-SO_3^- \quad (1\text{-}1)$$

$$M^+ \quad (1\text{-}2)$$

$$R^3-SO_3^- \quad (2\text{-}1)$$

$$H^+ \quad (2\text{-}2)$$

wherein,
   in the formula (1-1), $R^1$ represents a monovalent organic group having 1 to 30 carbon atoms or a fluorine atom; Z represents a single bond or a divalent linking group; and $R^2$ represents a single bond, a divalent hydrocarbon group having 1 to 10 carbon atoms or a divalent fluorinated hydrocarbon group having 1 to 10 carbon atoms,
   in the formula (1-2), $M^+$ represents a monovalent cation, and
   in the formula (2-1), $R^3$ represents a monovalent organic group having 1 to 30 carbon atoms.

2. The composition for resist pattern-refinement according to claim 1, wherein the ion represented by the formula (1-1) and the ion represented by the formula (1-2) are blended as a salt, and the ion represented by the formula (2-1) and the ion represented by the formula (2-2) are blended as a sulfonic acid.

3. The composition for resist pattern-refinement according to claim 2, wherein the sulfonic acid is represented by formula (2):

$$R^3-SO_3H \quad (2)$$

wherein, in the formula (2), $R^3$ is as defined in the formula (2-1).

4. The composition for resist pattern-refinement according to claim 2, wherein a difference obtained by subtracting a pKa value of the sulfonic acid from a pKa value of a conjugate acid of the ion represented by the formula (1-1) is no less than −2 and no greater than 2.

5. The composition for resist pattern-refinement according to claim 2, wherein the salt is represented by formula (1):

$$R^1-Z-R^2-SO_3^-M^+ \quad (1)$$

wherein, in the formula (1), $R^1$, Z and $R^2$ are each as defined in the formula (1-1); and $M^+$ is as defined in the formula (1-2).

6. The composition for resist pattern-refinement according to claim 1, wherein the organic group represented by $R^1$ in the formula (1) comprises a ring structure having 5 to 20 ring atoms.

7. The composition for resist pattern-refinement according to claim 6, wherein the ring structure is an alicyclic hydrocarbon structure.

8. A fine pattern-forming method comprising:
   forming a resist pattern; and
   refining the resist pattern with a composition for resist pattern-refinement, wherein
   the composition for resist pattern-refinement according to claim 1 is used as the composition for resist pattern-refinement.

9. The fine pattern-forming method according to claim 8, wherein the resist pattern is formed from a radiation-sensitive resin composition comprising a polymer comprising an acid-labile group, and a radiation-sensitive acid generator.

10. The fine pattern-forming method according to claim 8, wherein the temperature of the composition for resist pattern-refinement in refining the resist pattern is no greater than 110° C.

* * * * *